United States Patent
Kwag et al.

(10) Patent No.: US 9,565,745 B2
(45) Date of Patent: Feb. 7, 2017

(54) LIGHTING APPARATUS, LIGHTING CONTROL SYSTEM, AND METHOD OF CONTROLLING THE LIGHTING APPARATUS

(71) Applicant: SAMSUNG ELECTRONICS CO., LTD., Suwon-si (KR)

(72) Inventors: Heui-sam Kwag, Suwon-si (KR); Tae-Eung Kim, Suwon-si (KR); Yong-Min Jung, Suwon-si (KR); Ju-young Jung, Suwon-si (KR); Ho-chan Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/931,261

(22) Filed: Nov. 3, 2015

(65) Prior Publication Data

US 2016/0057839 A1  Feb. 25, 2016

Related U.S. Application Data

(63) Continuation of application No. 14/312,010, filed on Jun. 23, 2014, now Pat. No. 9,192,032.

(30) Foreign Application Priority Data

Aug. 13, 2013 (KR) .................. 10-2013-0096130

(51) Int. Cl.
*H05B 37/02* (2006.01)
*H05B 33/08* (2006.01)
*H04L 12/28* (2006.01)

(52) U.S. Cl.
CPC ....... *H05B 37/0272* (2013.01); *H04L 12/2816* (2013.01); *H05B 33/0842* (2013.01);
(Continued)

(58) Field of Classification Search
CPC ............ H05B 37/0218; H05B 33/0845; H05B 37/0227; H05B 33/0803; H05B 33/0842; H05B 33/0854; H05B 33/0809; H05B 33/0863; H05B 37/02; H05B 37/0245; H05B 33/0815; H05B 33/0818; H05B 33/0836; H05B 39/04; H05B 41/2828; H05B 41/36; H05B 41/3921; H05B 41/3927
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

KR  10-2011-0107993 A  1/2001
KR  20-0415596 Y1  5/2006
(Continued)

OTHER PUBLICATIONS

Office Action mailed Apr. 2, 2015, issued in parent U.S. Appl. No. 14/312,010.
(Continued)

*Primary Examiner* — Vibol Tan
(74) *Attorney, Agent, or Firm* — Sughrue Mion, PLLC

(57) ABSTRACT

A lighting apparatus connected to a network includes a light source for emitting light. A controller controls operation of the light source in response to an external control signal. A non-contact sensor detects a non-contact signal and generates a reset signal in response to detecting the non-contact signal. A communication interface communicatively connects the lighting apparatus to a wireless network to receive the external control signal from a remote apparatus via the wireless network and disconnects the lighting apparatus
(Continued)

from the wireless network in response to receiving the reset signal from the non-contact sensor.

17 Claims, 16 Drawing Sheets

(52) U.S. Cl.
CPC ..... *H05B 33/0848* (2013.01); *H05B 37/0218* (2013.01); *H05B 37/0227* (2013.01); *H04L 2012/285* (2013.01); *H04L 2012/2841* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,159,153 B2 * | 1/2007 | Kim | G06K 19/073 714/48 |
| 7,208,725 B2 | 4/2007 | Sherrer et al. | |
| 7,288,758 B2 | 10/2007 | Sherrer et al. | |
| 7,309,965 B2 * | 12/2007 | Dowling | G06Q 30/0201 315/312 |
| 7,319,044 B2 | 1/2008 | Han et al. | |
| 7,400,594 B2 | 7/2008 | Pereira et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,207,829 B2 | 6/2012 | De Goederen-Oei et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,669,716 B2 | 3/2014 | Recker et al. | |
| 8,692,786 B2 | 4/2014 | Diederiks et al. | |
| 8,735,931 B2 | 5/2014 | Han et al. | |
| 8,764,242 B2 * | 7/2014 | Recker | H02J 9/02 362/20 |
| 8,766,295 B2 | 7/2014 | Kim | |
| 2002/0084890 A1 | 7/2002 | Guerrieri et al. | |
| 2010/0052542 A1 * | 3/2010 | Siemiet | G01J 1/32 315/129 |
| 2011/0074672 A1 | 3/2011 | Diederiks et al. | |
| 2012/0119681 A1 | 5/2012 | Seidl et al. | |
| 2013/0063042 A1 * | 3/2013 | Bora | H05B 33/0863 315/292 |
| 2013/0145610 A1 * | 6/2013 | Feri | H05B 37/0227 29/592.1 |
| 2014/0300293 A1 * | 10/2014 | Ruan | H05B 33/0842 315/294 |

FOREIGN PATENT DOCUMENTS

| | | |
|---|---|---|
| KR | 10-2009-0099569 A | 9/2009 |
| KR | 10-2010-0125799 A | 12/2010 |
| KR | 10-2011-0106960 A | 9/2011 |
| KR | 10-2012-0000146 A | 1/2012 |

OTHER PUBLICATIONS

Notice of Allowance mailed Jul. 10, 2015, issued in parent U.S. Appl. No. 14/312,010.

* cited by examiner

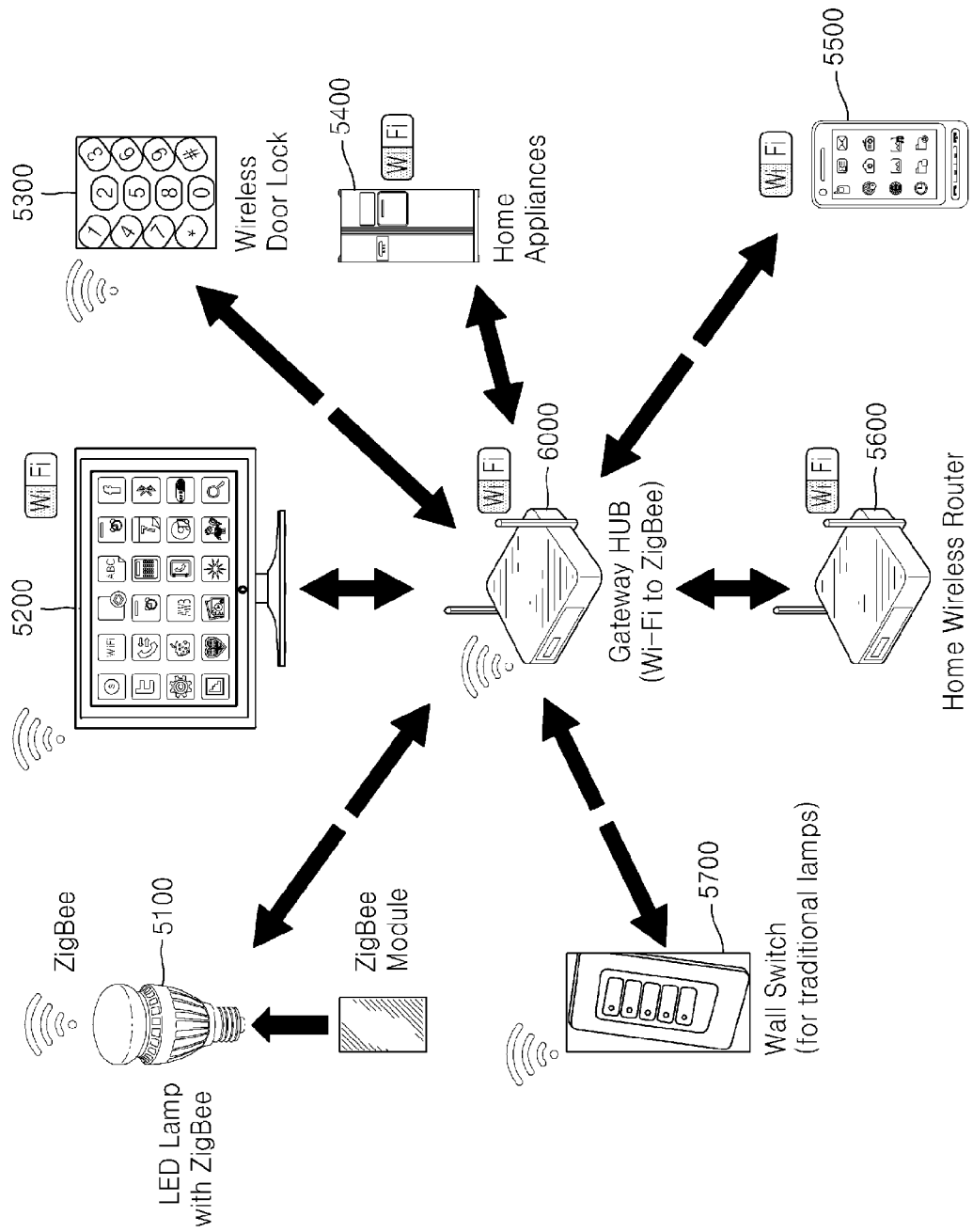

LIGHTING APPARATUS, LIGHTING CONTROL SYSTEM, AND METHOD OF CONTROLLING THE LIGHTING APPARATUS

CROSS-REFERENCE TO RELATED APPLICATION

This is a continuation of U.S. application Ser. No. 14/312,010 filed Jun. 23, 2014, which claims the benefit of Korean Patent Application No. 10-2013-0096130, filed on Aug. 13, 2013 in the Korean Intellectual Property Office, the disclosures of which are incorporated herein in their entirety by reference.

BACKGROUND OF THE INVENTION

The inventive concept relates to a lighting apparatus, a lighting control system, and a method of controlling the lighting apparatus. More particularly, the inventive concept relates to a lighting apparatus that is communicatively connected to a network and is controlled via communication through the network with an external apparatus, to a lighting control system including the lighting apparatus, and to a method of controlling a connection between the lighting apparatus and the network.

A light emitting diode (LED) having low power consumption and high light efficiency can be used as a light source to replace an incandescent electric lamp or a fluorescent lamp. The LED is additionally compatible with many light emitting controls, and can be used in a wide variety of applications. As such, the LED can be used in conjunction with systems configured for easily controlling lighting apparatuses inside and outside buildings based on wireless network communication have been actively conducted. Such control system can be used to provide different light outputs by controlling light color, light temperature, and light output.

SUMMARY OF THE INVENTION

The inventive concept provides a lighting apparatus that is easily connected to and disconnected from a wireless network and a lighting control system including the lighting apparatus.

The inventive concept also provides a method of controlling a lighting apparatus that is easily connected to and disconnected from a wireless network.

According to an aspect of the inventive concept, there is provided a lighting apparatus including a light source, a controller, a non-contact sensor, and a communication interface. The light source is configured to emit light. The controller is configured to control operation of the light source in response to an external control signal. The non-contact sensor is configured to detect a non-contact signal and to generate a reset signal in response to the non-contact signal. The communication interface is configured to communicatively connect the lighting apparatus to a wireless network to receive the external control signal from a remote apparatus via the wireless network and to disconnect the lighting apparatus from the wireless network in response to receiving the reset signal from the non-contact sensor.

The non-contact sensor may include at least one of a Hall sensor, a proximity sensor, or a magnetic resistance sensor.

The non-contact sensor may detect an approach of a magnetic substance to the lighting apparatus as the non-contact signal.

The communication interface may include an interface unit configured to communicate with the external apparatus via the wireless network by using a predetermined communication protocol, a network setting unit configured to control the interface unit to connect to or disconnect from the wireless network, and a memory configured to store network data related to the wireless network. The network setting unit may delete the network data related to the wireless network stored in the memory in response to receiving the reset signal from the non-contact sensor and controls the interface unit to search for a new network.

The non-contact sensor may generate a first reset signal when a polarity of the approaching magnetic substance is an N electrode, and generate a second reset signal different from the first reset signal when the polarity of the approaching magnetic substance is an S electrode.

The communication interface may disconnect the lighting apparatus from the wireless network and operates in a first reset mode to reconnect the lighting apparatus to the wireless network in response to receiving the first reset signal from the non-contact sensor, and disconnect the lighting apparatus from the wireless network and operates in a second reset mode to connect the lighting apparatus to another wireless network in response to receiving the second reset signal from the non-contact sensor.

The controller may turn the light source on/off or change at least one of a color temperature, chroma, or brightness of the light emitted from the light source in response to the external control signal.

The light source may include a circuit substrate and one or more light emitting devices or one or more light emitting device packages that are disposed on the circuit substrate, wherein the one or more light emitting devices include a first conductive semiconductor layer, an active layer, a second conductive semiconductor layer, a second electrode layer, an insulating layer, a first electrode layer, and a substrate that are sequentially stacked, wherein the first electrode layer includes one or more contact holes that are electrically insulated from the second conductive semiconductor layer and the active layer and that extend from a surface of the first electrode layer to a portion of the first conductive semiconductor layer in order to be electrically connected to the first conductive semiconductor layer, wherein the number of vias is 3 or more, distances between the vias have a matrix structure having rows and columns in a range from about 100 μm to about 500 μm, and depths of the vias are in a range from about 0.5 μm to about 5.0 μm, and wherein the one or more light emitting device packages include a phosphor layer on top surfaces of the one or more light emitting devices and generate a variety of white light having a color temperature in a range from 1500 K to 20000 K.

The one or more light emitting devices may include nano light emitting structures.

The wireless network may operate according to a ZigBee protocol.

According to another aspect of the inventive concept, there is provided a lighting control system including a lighting apparatus, a lighting controller, and a relay. The controller is configured to generate the external control signal. The relay is configured to receive the external control signal from the lighting controller and provide the external control signal to the lighting apparatus.

The lighting apparatus and the relay may transmit or receive a signal between each other using a same wireless communication protocol, and the lighting controller and the relay transmit or receive a signal between each other using a same wireless communication protocol or wired communication protocol.

According to another aspect of the inventive concept, there is provided a method of controlling a lighting apparatus connected to a network. The method includes detecting that a non-contact signal is generated outside of the lighting apparatus. A reset signal is generated in response to detecting the non-contact signal. The lighting apparatus is then disconnected from the network in response to generating the reset signal.

The generating of the reset signal may include: selectively generating a first reset signal or a second reset signal as the reset signal dependent on a type or pattern of the non-contact signal; and reconnecting the lighting apparatus to the network in response to generating the first reset signal and connecting the lighting apparatus to another network in response to generating the second reset signal.

The non-contact signal may be a magnetic signal.

According to another aspect of the inventive concept, a lighting control system includes a lighting apparatus and a lighting controller. The lighting apparatus is configured to emit light in response to a lighting control signal, and to receive the lighting control signal via a communication connection to a wireless network. The lighting controller is spaced apart from the lighting apparatus, and is configured to generate the lighting control signal and to transmit the lighting control signal across the wireless network. The lighting apparatus comprises a non-contact sensor configured to detect a non-contact signal, and the lighting apparatus is configured to disconnect from the wireless network in response to the non-contact sensor detecting a non-contact signal.

The lighting control system may further include a relay communicatively connected to the lighting apparatus via the wireless network and to the lighting controller, and configured to receive the lighting control signal from the lighting controller and to relay the received lighting control signal across the wireless network to the lighting apparatus.

The non-contract sensor may be configured to detect a change in a magnetic field, and to trigger the lighting apparatus to disconnect from the network in response to detecting the change in the magnetic field.

The lighting apparatus may be configured to connect to another wireless network in response to disconnecting from the wireless network, and to emit light in response to another lighting control signal received via the other wireless network.

The lighting apparatus may alternatively or additionally be configured to automatically search for one or more wireless networks to connect to in response to disconnecting from the wireless network.

BRIEF DESCRIPTION OF THE DRAWINGS

Exemplary embodiments of the inventive concept will be more clearly understood from the following detailed description taken in conjunction with the accompanying drawings in which:

FIG. 18 illustrates a home network to which a lamp is applied according to an embodiment of the inventive concept.

DETAILED DESCRIPTION OF THE INVENTION

Figure 1:
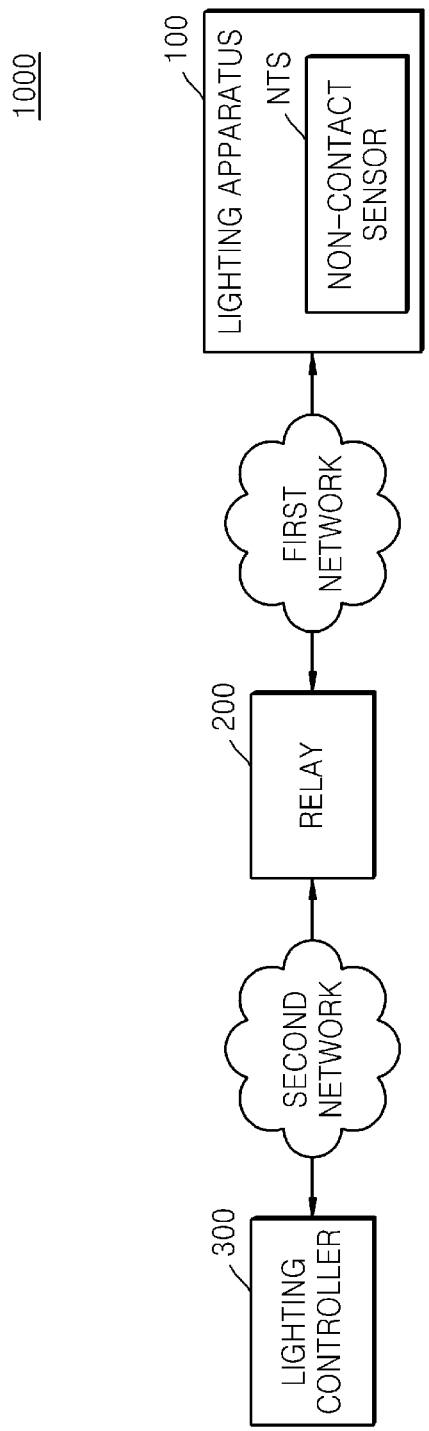
FIG. 1 is a block diagram of a lighting control system according to an embodiment of the inventive concept.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein. Thus, the invention may include all revisions, equivalents, or substitutions which are included in the concept and the technical scope related to the inventive concept Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components, and/or groups thereof.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not only modify the individual elements of the list.

FIG. 1 is a block diagram of a lighting control system 1000 according to an embodiment of the inventive concept. Referring to FIG. 1, the lighting control system 1000 includes a lighting controller 300 for generating a control message used to control lighting, and a lighting apparatus 100 for generating lighting according to the control message. The lighting control system 1000 may further include a relay 200 for communicatively connecting and relaying messages between the lighting controller 300 and the lighting apparatus 100.

When the lighting control system 1000 includes the relay 200, the lighting apparatus 100 and the relay 200 may be communicatively connected to each other through a first network, and the relay 200 and the lighting controller 300 may be communicatively connected to each other through a second network. The first and second networks may be the Internet, mobile communication networks, local area networks (LANs), or the like. The first and second networks may be homogeneous or heterogeneous networks, or interconnections of two or more networks.

The lighting apparatus 100, the relay 200, and the lighting controller 300 may connect to the first and second networks via various wired or wireless communication links, and may use wireless communication technologies such as WiFi, Bluetooth, ZigBee, or the like. When the lighting control system 1000 is located at least in part inside of a building, such as a house, office, factory, or the like, communication between the relay 200 and the lighting apparatus 100 or communication between the lighting controller 300 and the lighting apparatus 100 may be based on a ZigBee protocol. ZigBee is an Institute of Electrical and Electronics Engineers (IEEE) 802.15.4 based low power wireless short distance communication protocol which may be used to transmit data at a speed of 20 Kbps-250 Kbps at a short distance of 1 m-100 m. ZigBee has low power consumption and small program size, and is thus amenable to device miniaturization and has low implementation cost. Fast communication is not required to control the lighting apparatus 100, and thus communication technologies like ZigBee that are capable of low power and miniaturization while being limited to short distances and low speed may be used.

The lighting controller 300 may be spatially spaced apart from the lighting apparatus 100 and may control the turning on/off of the lighting apparatus 100 or the adjustment of lighting attributes, for example color, brightness, chroma, color temperature, a dimming period, or the like, via wireless or wired communication. The lighting controller 300 may be a portable terminal or a lighting control terminal such as a cellular phone, a smart phone, a notebook, a digital broadcasting terminal, a personal digital assistant (PDA), a portable multimedia player (PMP), a navigation system, and a remote control device.

The lighting controller 300 may generate a control message, for example a control signal, or data used to control the lighting apparatus 100 according to a previously set program (e.g., a program stored in a memory of the lighting controller 300) or a user signal input through an input unit such as a keypad, a touch pad, or the like. The lighting controller 300 may provide the control signal or the data to the lighting apparatus 100 or receive information regarding a state of the lighting apparatus 100 by communicating with the relay 200.

The lighting controller 300 may include a mobile communication module, a wireless Internet module, a short distance communication module, or the like to communicate with the relay 200. The mobile communication module transmits and receives a wireless signal to and from at least one of a base station, an external terminal, or a server communicatively connected to a mobile communication network. The wireless Internet module is a module enabling wireless Internet access, and may be mounted inside or outside the lighting controller 300. The short distance communication module is a module configured for short distance communication and may include a wireless LAN card.

The wireless LAN card may enable wireless communication in accordance with the 802.11 wireless network standard specification for a wireless LAN proposed by the IEEE, and/or enable wireless communication through a wireless LAN including some infrared communication. The wireless LAN card may alternatively or additionally enable communication in accordance with the 802.15 standard protocol specification for a wireless personal area network (PAN) including Bluetooth, ultra wideband (UWB), ZigBee, or the like. The wireless LAN card may alternatively or additionally enable communication in accordance with the 802.16 standard protocol specification for a wireless metropolitan area network (MAN) broadband wireless access (BWA) including a fixed wireless access (FWA). Alternatively or additionally, the wireless LAN card may enable communication in accordance with the 802.20 mobile Internet standard protocol specification for a wireless mobile broadband wireless access (MBWA) including Wibro, WiMAX, or the like.

The relay 200 enables wired or wireless communication between the lighting controller 300 and the lighting apparatus 100. For example, the relay 200 transmits the control message received from the lighting controller 300 to the lighting apparatus 100, and may be an access point (AP), a gateway, or the like. The relay 200 is separate and distinct from the lighting controller 300 and the lighting apparatus 100 in the present embodiment, but is not limited thereto. For example, the relay 200 may be an element of the lighting controller 300 in some embodiments.

The relay 200 may establish a communication connection to one or more external devices such as the lighting controller 300, the lighting apparatus 100, or the like in response to the external device initiating the establishment of a communication connection. Network information, for example, an Internet protocol (IP) address, a PAN ID (personal area network identification), a device address, a channel, or the like may be assigned to the external device. When the lighting control system 1000 includes a plurality of lighting apparatuses 100, the relay 200 may communicate with each of the lighting apparatuses 100 based on the network information.

The relay 200 may include a mobile communication module, a wireless Internet module, a short distance communication module, or the like, configured for communication across a network connection to the lighting apparatus 100 and the lighting controller 300. The short distance communication module may include a wireless communication module operating according to WiFi, Bluetooth, ZigBee, or similar standards.

When the relay 200 is operative to relay communication between devices operating according to different communication protocols, the relay 200 may perform protocol conversion between the devices. For example, when a communication protocol of the lighting controller 300 is based on the 802.11 wireless network standard specification, and a communication protocol of the lighting apparatus 100 is based on the 802.15 wireless network standard specification, the relay 200 may convert a message received from the lighting controller 300 into the protocol that can be processed by the lighting apparatus 100 and transmit the converted message to the lighting apparatus 100. As described above, when the lighting controller 300 and the lighting apparatus 100 operate using different communication protocols, the relay 200 may include a plurality of communication modules that each communicate according to a different one of the protocols.

External devices between which the relay 200 is operative to send communications are referred to as relay targets. The relay 200 may store information regarding the relay target in a storage unit or memory (not shown). The information regarding the relay target (or external device) includes information used to identify the external device such as an IP address of the relay target, a media access control (MAC) address, a product name, function information, or the like. When the relay target is the lighting apparatus 100, the relay 200 may store information regarding a space in which the lighting apparatus 100 is located in the storage unit. In addition, the relay 200 may store information regarding a communication protocol used by the relay target in the storage unit.

Although a single relay 200 is shown and described in the present embodiment, the inventive concept is not limited thereto. The system 1000 may include multiple relays 200. Additionally, each relay 200 may include a combination of a gateway, an AP, a server, and/or the like. In some examples, the lighting controller 300 may directly control the lighting apparatus 100 without the relay 200. In such examples, communication messages transmitted by the lighting controller 300 are directly routed to the light 100 without passing through the relay 200.

The lighting apparatus 100 is used to emit light and generate specific lighting. The lighting apparatus 100 may include a plurality of light emitting devices that provide various colors, brightness, and chroma of lighting. The light emitting devices may be light emitting diodes (LEDs) but are not limited thereto. The light emitting devices may be fluorescent lamps. The light emitting devices may be combinations of LEDs and fluorescent lamps. The lighting control system 1000 may include a plurality of lighting apparatuses 100. The lighting controller 300 may selectively and separately control individual ones of the lighting apparatuses 100, may jointly control two or more of the lights 100, or may separately control various groupings of one or more lights 100.

The lighting apparatus 100 may be controlled according to a control message from the lighting controller 300, for example a control signal or data, and provide data regarding a lighting state to the lighting controller 300. The control signal or the data may be transmitted and received by the light 100 via communication between the lighting apparatus 100 and the relay 200. To this end, the lighting apparatus 100 may include a mobile communication module, a wireless Internet module, a short distance communication module, or the like. As described above, when the lighting apparatus 100 is mounted inside a building, the lighting apparatus 100 may include a ZigBee wireless communication module.

The lighting apparatus 100 may request communication from the relay 200, be permitted for communication from the relay 200, and be connected to a network including the relay 200. The lighting apparatus 100 may be assigned and receive an IP address, a PAN ID, a device address, a channel, or the like from the relay 200 to perform communication.

The lighting apparatus 100 of the present embodiment may include a non-contact sensor NTS operative to perform a network reset operation so as to allow the lighting apparatus 100 to be disconnected from the network and reconnected to a new network. When the lighting apparatus 100 is connected to a wrong network or is not normally or functionally connected to the network, the lighting controller 300 may not be able to control the lighting apparatus 100. In such a situation, a user may need to personally control the lighting apparatus 100 and reset the network so as to allow the lighting apparatus 100 to be normally controlled by the lighting controller 300. Specifically, the user may need to activate a switch on the light 100 so as to allow the light 100 to become associated with the network and communicatively connected to the lighting controller 300. However, when the lighting apparatus 100 emits light for a long time, the user may not be able to directly contact the light 100 due to a high temperature of the lighting apparatus 100. In this regard, the user may use the non-contact sensor NTS to generate a reset signal for resetting the network without having to contact the lighting apparatus 100. Additionally, a small-sized lighting apparatus such as a lamp type lighting apparatus may have an insufficient space for accommodating a switch used to reset the network on a surface thereof. Thus, the non-contact sensor NTS may be included in the lighting apparatus and used for this purpose. The non-contact sensor NTS may detect a signal externally generated by the user, for example a magnetic signal generated by allowing a magnetic substance to move near the light 100 and non-contact sensor NTS according to a user action, and generate the reset signal. The network of the lighting apparatus 100 may be reset in response to the reset signal. The lighting apparatus 100 and a method of controlling the lighting apparatus 100 according to an embodiment of the inventive concept will now be describe below.

Figure 2:
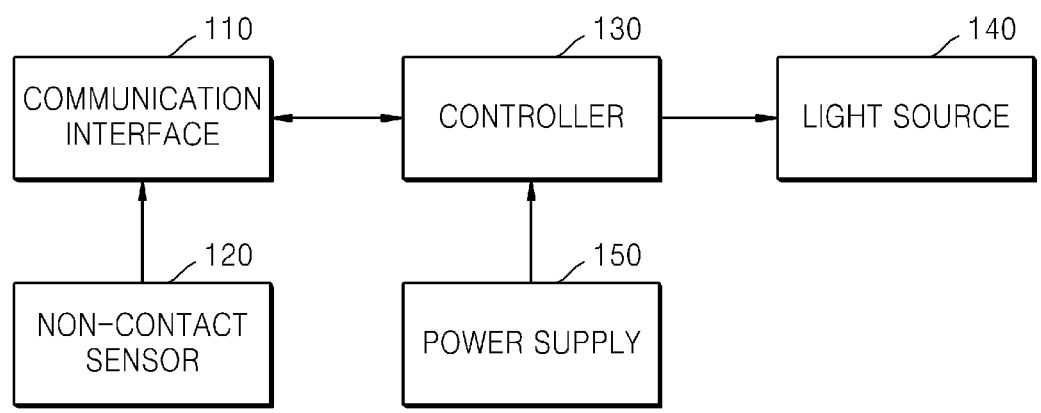
FIG. 2 is a block diagram of a lighting apparatus according to an embodiment of the inventive concept.

FIG. 2 is a block diagram of the lighting apparatus 100 according to an embodiment of the inventive concept. Referring to FIG. 2, the lighting apparatus 100 may include a communication interface 110 that communicates with the relay 200 or the lighting controller 300, a non-contact sensor 120 that detects a non-contact signal from the outside and generates a reset signal, a light source 140 including a plurality of light emitting devices, a controller 130 that controls and operates the light source 140, and a power supply 150 that supplies power.

The light source 140 may include at least one of a red light emitting device that emits red light, a green light emitting device that emits green light, and a blue light emitting device that emits blue light. The light source 140 may include a plurality of white light emitting devices that emit white light and have different color temperatures. The light source 140 may have different numbers of light emitting devices according to a size of a space in which light emitting devices are to be installed, the intended uses of the light emitting devices, or the like, and/or may have different numbers or ratios of red light emitting devices, green light emitting devices, blue light emitting devices, and white light emitting devices.

The controller 130 operates the light source 140 according to a control message received from the outside. The controller 130 may turn on or off all or some of light emitting devices of the light source 140 according to the control message. The controller 130 may change lighting properties of the light source 140 such as a temperature of light, brightness, chroma, or the like by changing an amount of current input into different light emitting devices of the light source 140 or changing a time at which the current is input.

The power supply 150 may modify a voltage applied from the outside or internally generate a voltage to generate a drive voltage or current used to operate the light source 140. In addition, the power supply 150 may generate and provide a voltage used to power each of the elements of the lighting apparatus 100.

The communication interface 110 may communicatively connect the lighting apparatus 100 to a network, and may communicate with a remote apparatus such as the relay 200 (and/or the lighting controller 300) to transmit information regarding the lighting apparatus 100 to the relay 200 or receive the control message from the relay 200. The communication interface 110 may include a mobile communication module, a wireless Internet module, a short distance communication module, or the like and may communicate with the relay 200 by using at least one of the received modules. For example, the communication interface 110 may include a ZigBee communication module as a communication module, and communicate using the ZigBee communication standard with the relay 200.

The communication interface 110 may cause the network to reset in response to receiving a reset signal provided from the non-contact sensor 120. Specifically, the communication interface 110 may disconnect from a previously connected network in response to receiving the reset signal, and may automatically search for available networks and connect to one of the identified available networks following the disconnection. The lighting apparatus 100 may connect to a new network following disconnection from a previously connected network resulting from the network reset operation, or may reconnect to the same network it was previously connected to.

The non-contact sensor 120 detects a non-contact signal from the outside and generates a reset signal for resetting the network. The non-contact sensor 120 may be implemented as a proximity sensor, a Hall sensor, a magnetic resonance (MR) sensor, or the like. A non-contact signal may be a movement of an object near the non-contact sensor 120, an electrical or magnetic signal (e.g., a change in magnetic field), or the like. For example, when the non-contact sensor 120 is a Hall sensor, the non-contact signal may be a magnetic signal. If a magnet or magnetic substance approaches the Hall sensor and a magnetic field is generated in proximity to the sensor, the sensor may detect the magnetic signal and generate a reset signal.

Meanwhile, the non-contact sensor 120 may generate one of various types of reset signals according to a value of a non-contact signal or a pattern thereof. In this regard, the communication interface 110 may differentiate between various signals or patterns and determine whether a detected signal or pattern corresponds to a sequence for resetting a network according to the reset signal. A network reset operation performed by the communication interface 110 according to the reset signal will be described in detail with reference to FIGS. 5 through 7 below.

Figure 3A:
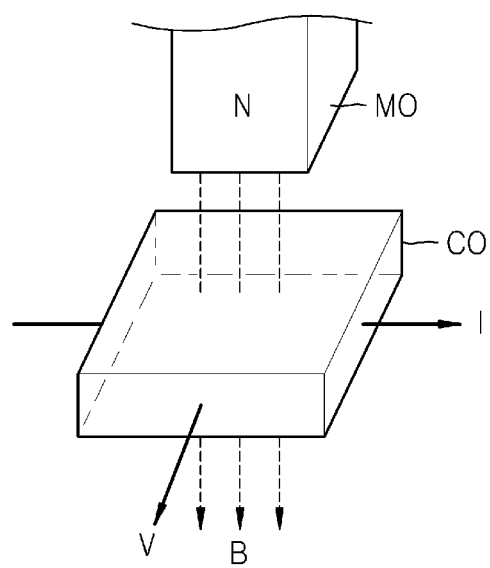
FIG. 3A is a diagram illustratively explaining operation of a Hall sensor as an example of a non-contact sensor of FIG. 2.
Figure 3B:
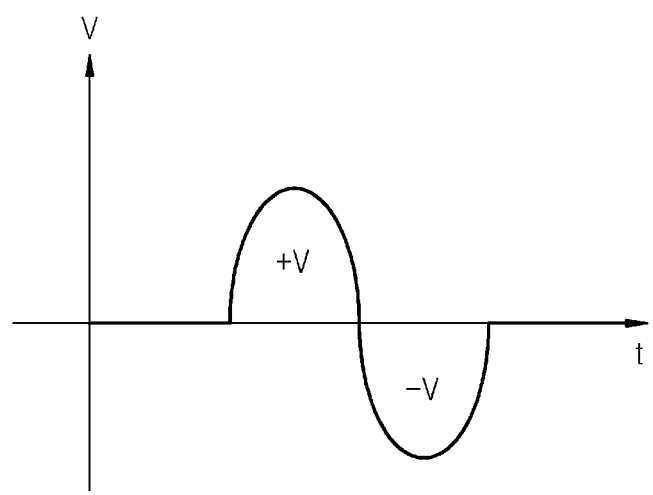
FIG. 3B is a graph of an output signal of the Hall sensor.

FIG. 3A is a diagram for explaining an operation of a Hall sensor as an example of a non-contact sensor of FIG. 2. FIG. 3B is a graph of an output signal of the Hall sensor.

The Hall sensor is a sensor that produces an output signal based on the Hall effect. The Hall effect is the production of a voltage in a direction perpendicular to a magnetic field if the magnetic field is applied to a conductor through which a current flows. Referring to FIG. 3A, the Hall sensor may include a conductor CO through which current I flows. If a magnetic field B is generated by allowing a magnetic substance MO such as a magnet to move near the Hall sensor, a voltage V may be generated in a direction perpendicular to the magnetic field B. If the voltage V of a predetermined level is generated, the Hall sensor may detect an occurrence of a non-contact signal, i.e. a magnetic signal, and generate a reset signal.

Meanwhile, when a polarity of the magnetic substance MO approaching the Hall sensor is changed, a polarity of the voltage V may be changed as shown in FIG. 3B. Referring to FIG. 3B, the voltage V is not generated when the magnetic substance MO does not approach the Hall sensor, whereas the voltage V is generated when the magnetic substance MO approaches the Hall sensor. A positive voltage +V or a negative voltage −V may be generated according to the polarity of the magnetic substance MO. The Hall sensor may generate the reset signal based on the generated voltage V, and generate a first reset signal or a second reset signal according to the polarity of the magnetic substance MO as described above. The Hall sensor generates a first reset signal when a polarity of the approaching magnetic substance is an N electrode, and generates a second reset signal when the polarity of the approaching magnetic substance is an S electrode. The Hall sensor may also selectively generate the first reset signal or the second reset signal according to a signal generation pattern, for example depending on whether a non-contact signal is detected one time, multiple times (e.g., two times), or continuously (e.g., continuously for a period of time exceeding a predetermined threshold). In addition, the Hall sensor may generate a plurality of different reset signals in response to having applied thereto various signal generation patterns.

Figure 4A:
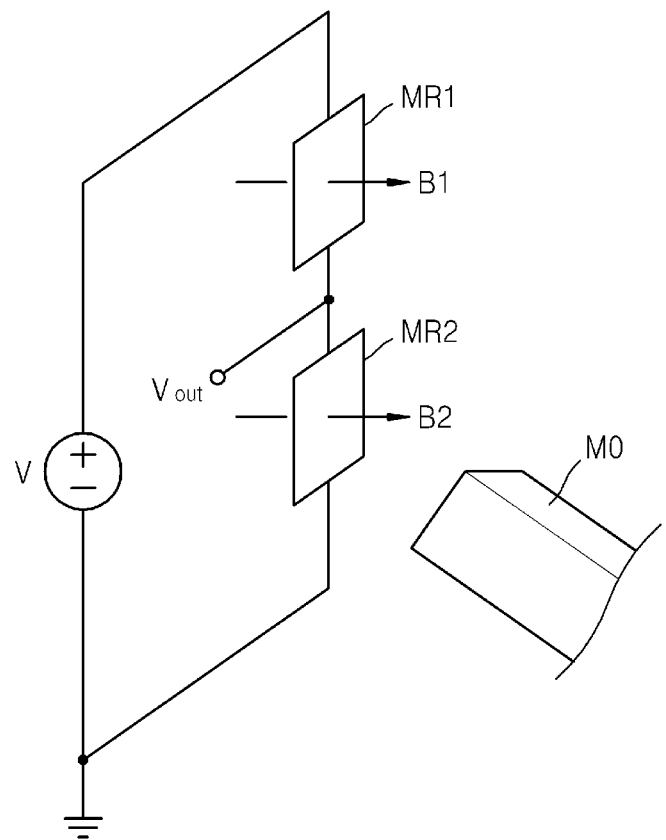
FIG. 4A is a diagram illustratively explaining operation of a magneto resistive (MR) sensor as an example of a non-contact sensor of FIG. 2.
Figure 4B:
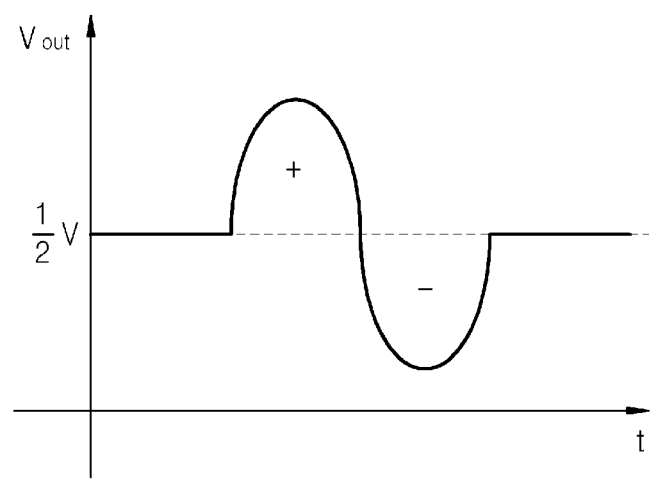
FIG. 4B is a graph of an output signal of the MR sensor.

FIG. 4A is a diagram for explaining an operation of a magneto resistive (MR) sensor as an example of the non-contact sensor 120 of FIG. 2. FIG. 4B is a graph of an output signal of the MR sensor. The MR sensor is a sensor that produces an output signal based on a magnetic resistance effect in which a magnetic resistance of a material varies due to a magnetic field. The MR sensor may detect a variation of a magnetic field or an existence of a magnetic substance as a variation of a voltage. Referring to FIG. 4A, the MR sensor includes two MR devices MR1 and MR2 connected in series, and applies a voltage V across the series connection of MR devices MR1 and MR2. Magnetic fields B1 and B2 are respectively applied to the MR devices MR1 and MR2, and a node common to the MR devices MR1 and MR2 is set as an output node. In this regard, if the magnetic fields B1 and B2 applied to the MR devices MR1 and MR2 are the same, no signal is generated. However, if the magnetic substance MO approaches only one of the MR devices MR1 and MR2, the magnetic fields B1 and B2 become unequal and the resistance values of the MR devices MR1 and MR2 are changed. As a result, an output voltage Vout is changed. Referring to FIG. 4B, when the magnetic fields B1 and B2 applied to the MR devices MR1 and MR2 are the same, an output voltage Vout is a predetermined reference voltage, for example, ½*V. If the magnetic field B2 applied to the MR device MR2 becomes stronger, the resistance of the MR device MR2 increases and the output voltage Vout increases (+). In contrast, if the magnetic field B1 applied to the MR device MR1 becomes stronger, the resistance of the MR device MR1 increases and the output voltage Vout decreases (−). The MR sensor may detect whether the output voltage Vout increases or decreases compared to a predetermined reference voltage, i.e., the output voltage Vout when the magnetic fields B1 and B2 are the same (e.g., ½*Vout). The MR sensor can then determine that a non-contact signal is applied to the sensor, and generate a reset signal according to results of the determination. In this regard, the MR sensor may generate a first reset signal or a second reset signal according to whether the output voltage Vout increases (+) or decreases (−). Alternatively, the MR sensor may generate a first reset signal or a second reset signal according to a pattern of the detected non-contact signal such as whether a variation of the output voltage Vout occurs one time, multiple times (e.g., two times), or continuously for a predetermined period of time. In addition, the MR sensor may generate a plurality of different types of reset signals in response to having applied thereto various signal generation patterns.

The operation of the Hall sensor and the MR sensor as non-contact sensors is described above. Various other types of non-contact sensors may be additionally or alternatively be used in the lighting apparatus in accordance with the inventive concept.

Figure 5:
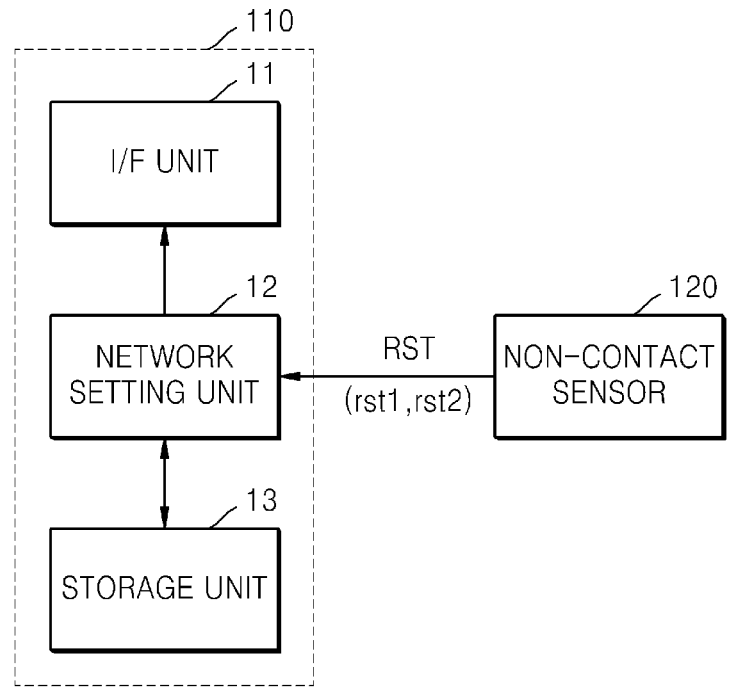
FIG. 5 is a block diagram of a communication interface of the lighting apparatus of FIG. 2 according to an embodiment of the inventive concept.

FIG. 5 is a detailed block diagram showing components of the communication interface 110 of the lighting apparatus 100 of FIG. 2 according to an embodiment of the inventive concept. The non-contact sensor 120 is also shown for convenience of description.

Referring to FIG. 5, the communication interface 110 may include an interface unit 11, a network setting unit 12, and a storage unit 13.

The interface unit 11 transmits and receives a signal to and from an external apparatus connected to a network by using a set communication methods and protocols. For example, the interface unit 11 may communicate with the external apparatus by using a ZigBee protocol, and may additionally be operative to communicate according to several other protocols.

The network setting unit 12 searches for a network that may be used to communicate with the lighting apparatus 100 and connects the lighting apparatus 100 to the network. For example, if power is applied to the lighting apparatus 100, the network setting unit 12 determines whether the lighting apparatus 100 is connected to a network. In this regard, the network setting unit 12 may determine whether the lighting apparatus 100 is connected to a network according to a value of a data bit indicating a connection to the network. The network setting unit 12 also may determine whether the lighting apparatus 100 is connected to a network according to whether network information is stored in the storage unit 13 or is valid. The network information may include an IP address, a PAN ID, a device address, a channel, or the like. If the network information is not stored in the storage unit 13, the network setting unit 12 may determine that the lighting apparatus 100 is not connected to the network. The network setting unit 12 may request a connection to the network based on the network information stored in the storage unit 13. If there is no response to the request and the network information is not valid, the network setting unit 12 may determine that the lighting apparatus 100 is not connected to any network. If the network setting unit 12 determines that the lighting apparatus 100 is not connected to any network, the network setting unit 12 may search for networks that may be used to communicate with the lighting apparatus 100, identify one or more candidate networks in response to the search, and request a connection to a selected one of the candidate networks by sending a request to the relay 200 of the selected network. In response to sending the request, the network setting unit 12 may receive a response from the relay 200 indicating that the lighting apparatus 100 may connect to the selected network and including network information for use by the lighting apparatus 100 and the relay 200 while communicating across the network.

The network setting unit 12 may reset the network if a reset signal RST is received from the non-contact sensor 120. In response to receiving a reset signal RST, the network setting unit 12 disconnects the lighting apparatus 100 from the network. Furthermore, the network setting unit 12 may search for a candidate network and, once a candidate network is found, connect the lighting apparatus 100 to the found network. The network search and connection may be performed a predetermined period of time after the lighting apparatus has disconnected from the previously connected network. The lighting apparatus 100 may connect to the previously connected network or to a new or different network.

In this regard, the disconnection from the network may include the network setting unit 12 deleting the network information stored in the storage unit 13 or changing a value of a data bit indicating the connection to the network.

Meanwhile, in embodiments in which various types of reset signals RST are generated by the non-contact sensor 120, the network setting unit 12 may perform a different reset operation depending on the particular reset signal RST received. For example, the network setting unit 12 may reconnect the lighting apparatus 100 to the previously connected network if a first reset signal rst1 is received, and may search for a new network (e.g., a network different from the previously connected network) and connect the lighting apparatus 100 to the new network if a second reset signal rst2 is received. This will be described in more detail with reference to FIGS. 7A and 7B.

The storage unit 13 may store information necessary for connecting to and communicating through a network. The storage unit 13 may store the network information assigned to the lighting apparatus 100 by the relay 200 of FIG. 1 or the lighting controller 300 of FIG. 1 in response to the lighting apparatus 100 connecting to the associated network. The network information may include, for example, the IP address, the PAN ID, the device address, the channel, or the like, to be used for communication across the network. The storage unit 13 may store a network connection algorithm that is automatically accessed by the network setting unit 12 and used to search for and connect to a network during an initial operation of the lighting apparatus 100.

The storage unit 13 may be a non-volatile memory, and may be any of a flash memory, an electrically erasable programmable read only memory (EEPROM), a magnetic random access memory (MRAM), a phase change memory (PRAM), or the like.

Figure 6:
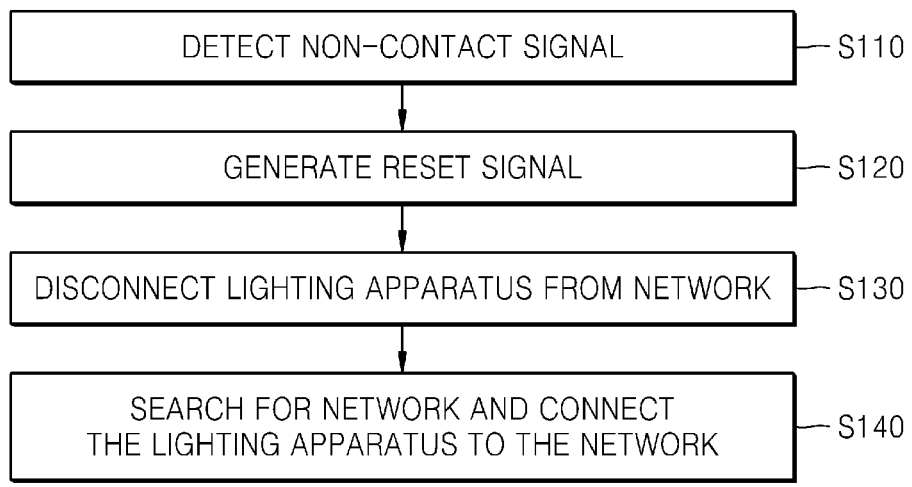
FIG. 6 is a flowchart of a method of controlling a lighting apparatus according to an embodiment of the inventive concept.

FIG. 6 is a flowchart illustratively showing a method for controlling the lighting apparatus 100 according to an embodiment of the inventive concept.

Referring to FIG. 6, a determination is made as to whether a signal, for example a non-contact signal generated in response to a magnet being located in proximity to (or outside of) the lighting apparatus 100, is detected (operation S110). The generation of the non-contact signal is detected by using the non-contact sensor 120. The detection may be performed if power is applied to the lighting apparatus 100 irrespective of whether the lighting apparatus 100 normally operates or is connected to a network.

If it is detected that the non-contact signal is generated, a reset signal is generated (operation S120). For example, when the non-contact sensor 120 is a Hall sensor, if a user approaches a magnet or other magnetic substance near the lighting apparatus 100, the Hall sensor may generate a voltage. When the voltage is greater than a reference voltage, the Hall sensor may determine that the non-contact signal, i.e. a magnetic signal, is detected and may generate the reset signal If the reset signal is generated, the communication interface 110 disconnects the lighting apparatus 100 from a network in response to the reset signal (operation S130) if the lighting apparatus 100 was connected to the network. Thereafter, an operation of searching for a new network is performed (operation S140), and if a new network is identified, the lighting apparatus 100 connects to the new network. In this regard, the lighting apparatus 100 may connect to the network from which the lighting apparatus 100 was disconnected in step S130, or may connect to another network.

Figure 7A:
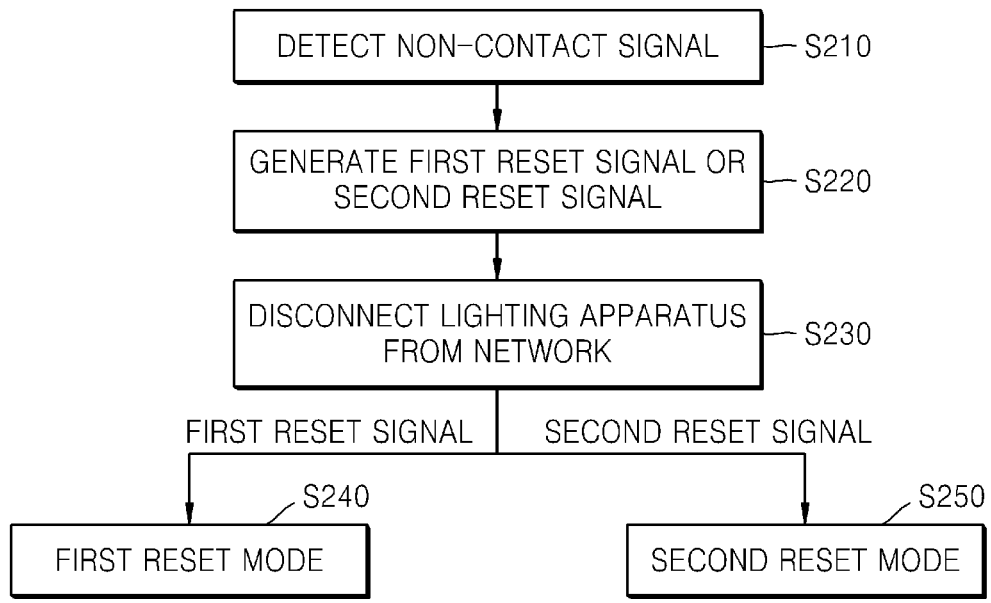
FIGS. 7A through 7C are flowcharts of a method of controlling a lighting apparatus according to another embodiment of the inventive concept.
Figure 7B:
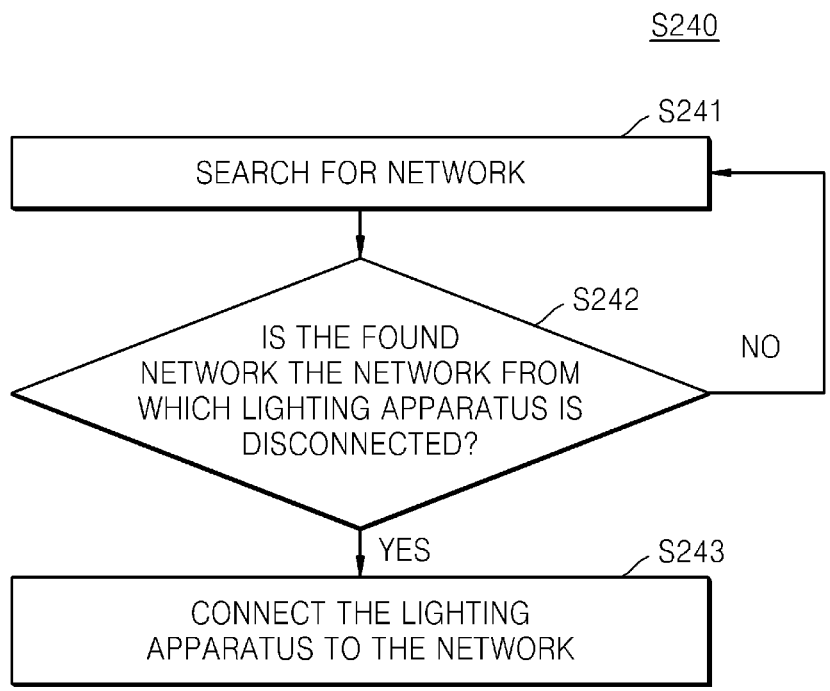
Figure 7C:
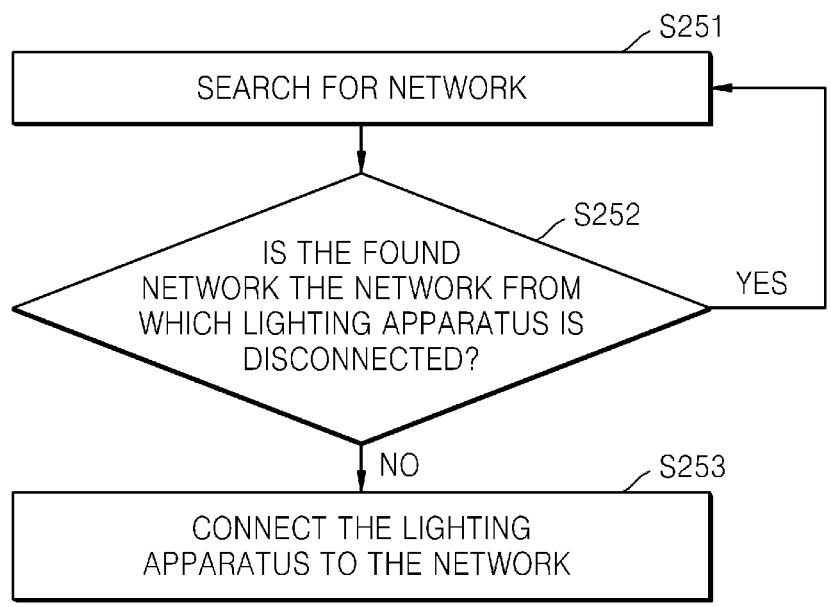

FIG. 7A is a flowchart of a method of controlling the lighting apparatus 100 according to another embodiment of the inventive concept. FIG. 7B is a flowchart of the method of FIG. 7A that is performed in a first reset mode. FIG. 7C is a flowchart of the method of FIG. 7A that is performed in a second reset mode.

Referring to FIG. 7A, a determination is made as to whether a signal, for example a non-contact signal generated in response to a magnet being located in proximity to (or outside of) the lighting apparatus 100, is detected (operation S210). The generation of the non-contact signal is detected by using the non-contact sensor 120. The detection may be performed if power is applied to the lighting apparatus 100 irrespective of whether the lighting apparatus 100 normally operates or is connected to a network.

If it is detected that the non-contact signal is generated, a reset signal is generated (operation S220). In this regard, the non-contact sensor 120 may selectively generate one of a first reset signal or a second reset signal depending on a value of the non-contact signal or a pattern thereof.

If a reset signal is generated, the lighting apparatus 100 is disconnected from a network (operation S230).

Thereafter, if the reset signal generated in step S220 is the first reset signal, the lighting apparatus 100 operates in the first reset mode (operation S240) and reconnects to the network from which the lighting apparatus 100 disconnected in step S230. If the reset signal generated in step S220 is the second reset signal, the lighting apparatus 100 operates in the second reset mode (operation S250) and connects to another network different from the network from which the lighting apparatus 100 disconnected in step S230.

Referring to FIG. 7B, as part of operation S240 of the first reset mode, the lighting apparatus 100 searches for one or more networks to connect to (operation S241). A determination is made as to whether a found network is the network from which the lighting apparatus 100 disconnected in step S230 (operation S242). It may be determined whether the found network is the network from which the lighting apparatus 100 was disconnected by identifying a PAN ID of the found network. If the PAN ID of the found network is identical to or otherwise matches network information stored in the storage unit 130, e.g. stored network information including a PAN ID of the network from which the lighting apparatus 100 was disconnected, the found network may be determined to be the network from which the lighting apparatus 100 was disconnected. In this regard, if the found network is the network from which the lighting apparatus 100 was disconnected, the lighting apparatus 100 may connected to the found network (operation S243). Alternatively, if the found network is not the network from which the lighting apparatus 100 was disconnected, operation returns to operation S241 such that another network can be searched for.

Referring to FIG. 7C, as part of operation S250 of the second reset mode, the lighting apparatus 100 searches for one or more networks to connect to (operation S251). A determination is made as to whether a found network is the network from which the lighting apparatus 100 disconnected in step S230 (operation S252). If the found network is not the network from which the lighting apparatus 100 disconnected, the lighting apparatus 100 may connect to the found network which corresponds to a network other than the network from which the lighting apparatus 100 was disconnected in operation S230 (operation S253). Alternatively, if the found network is the network from which the lighting apparatus 100 disconnected, operation returns to operation S251 such that another network can be searched for.

Figure 8:
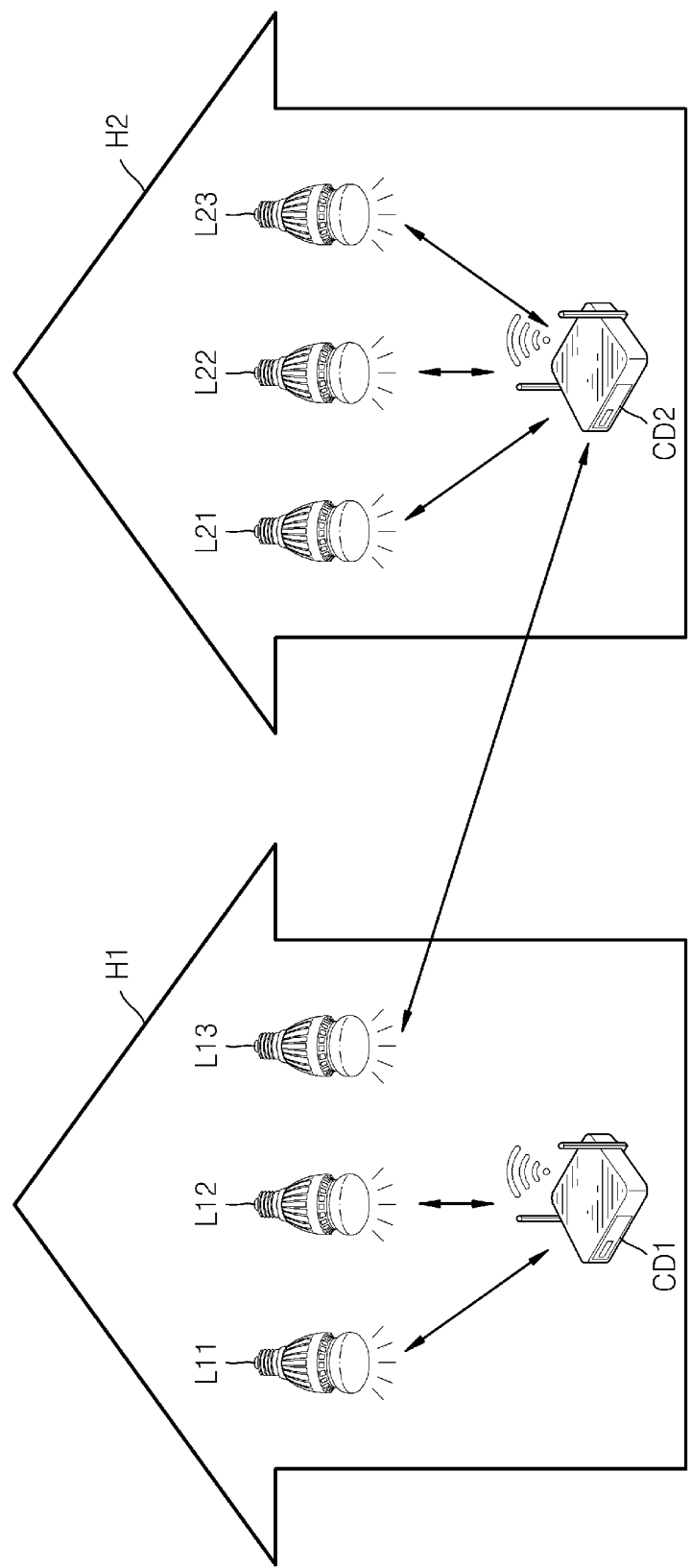
FIG. 8 is a diagram illustratively explaining connections between lighting apparatuses and a plurality of networks according to an embodiment of the inventive concept.

FIG. 8 is a diagram for explaining connections between lighting apparatuses and a plurality of networks according to an embodiment of the inventive concept.

As shown in FIG. 8, when relays CD1 and CD2 are respectively installed in two neighboring houses H1 and H2, different networks exist. The first relay CD1 controls lighting apparatuses L11, L12, and L13 installed inside the house H1, and the second relay CD2 controls lighting apparatuses L21, L22, and L23 installed inside the house H2. However, when a new lighting apparatus or an additional lighting apparatus is installed, the new lighting apparatus or the additional lighting apparatus may be connected to an unwanted network. For example, the lighting apparatus L13 that needs to communicate with the first relay CD1 may be connected to a network of the neighboring house H2, i.e. a network of the second relay CD2. In this case, the first relay CD1 is unable to control the lighting apparatus L13 connected to the other network. In this regard, the lighting apparatus L13 may be a lighting apparatus 100 of FIG. 1 according to the present embodiment. The lighting apparatus L13 may be disconnected from the network of the neighboring house H2 and reconnected to a network of house H1 in response to a reset signal generated by a non-contact sensor 120 of lighting apparatus L13. For example, a user may generate a non-contact signal by approaching a magnet or other magnetic substance to the non-contact sensor 120 of lighting apparatus L13. The non-contact sensor 120 may detect the non-contact signal, and generate the reset signal. In this regard, the lighting apparatus L13 needs to be connected to the first relay CD1 and not to the second relay CD2. As described with reference to FIGS. 7A to 7C in which a lighting apparatus operates differently according to a type of the reset signal, the user may cause the non-contact sensor 120 to generate a second reset signal. In response to the second reset signal, the lighting apparatus L13 operates according to the second reset mode described with reference to FIG. 7C above. As a result, lighting apparatus L13 disconnects from the network of house H2 and connects instead to the network of house H1. Alternatively, when the lighting apparatus needs to be reconnected to the same network it is currently connected to, the user may cause the non-contact sensor 120 to generate the first reset signal such that the lighting apparatus L13 operates in accordance with the first reset mode described with reference to FIG. 7B above.

Figure 9:
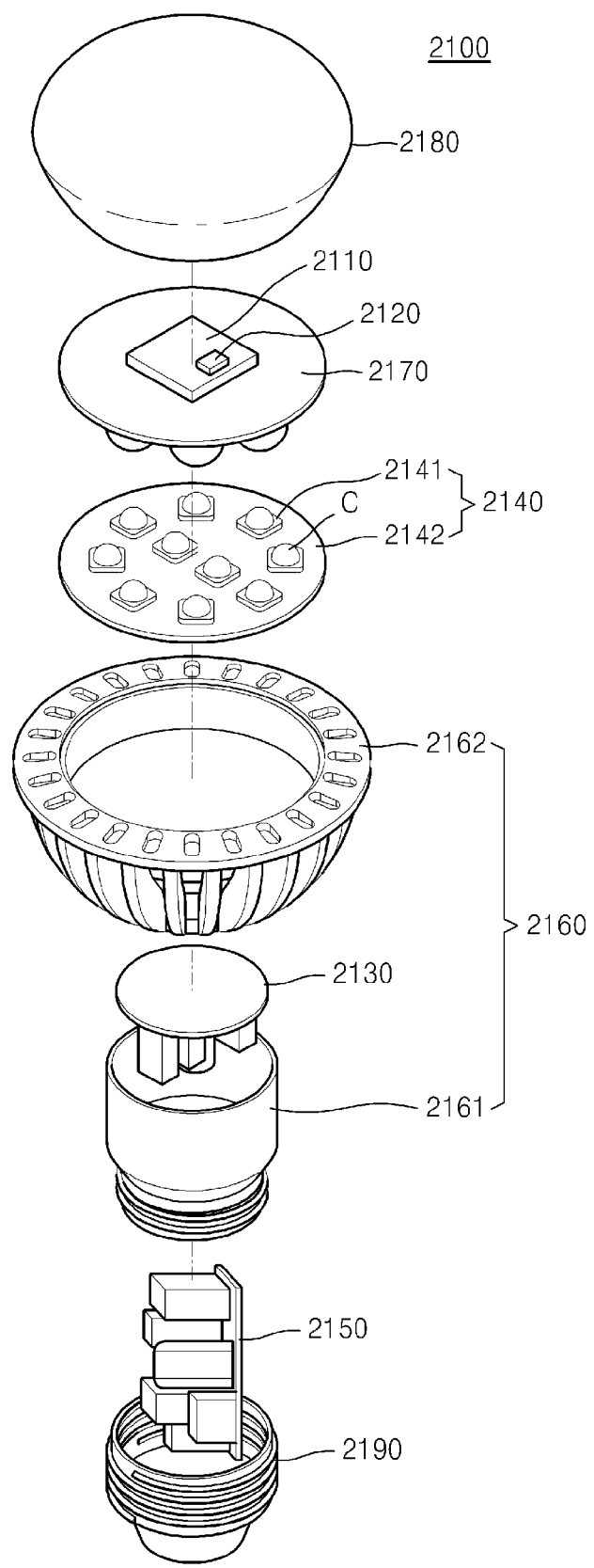
FIG. 9 is an exploded perspective view of a lamp according to an embodiment of the inventive concept.
Figure 10:
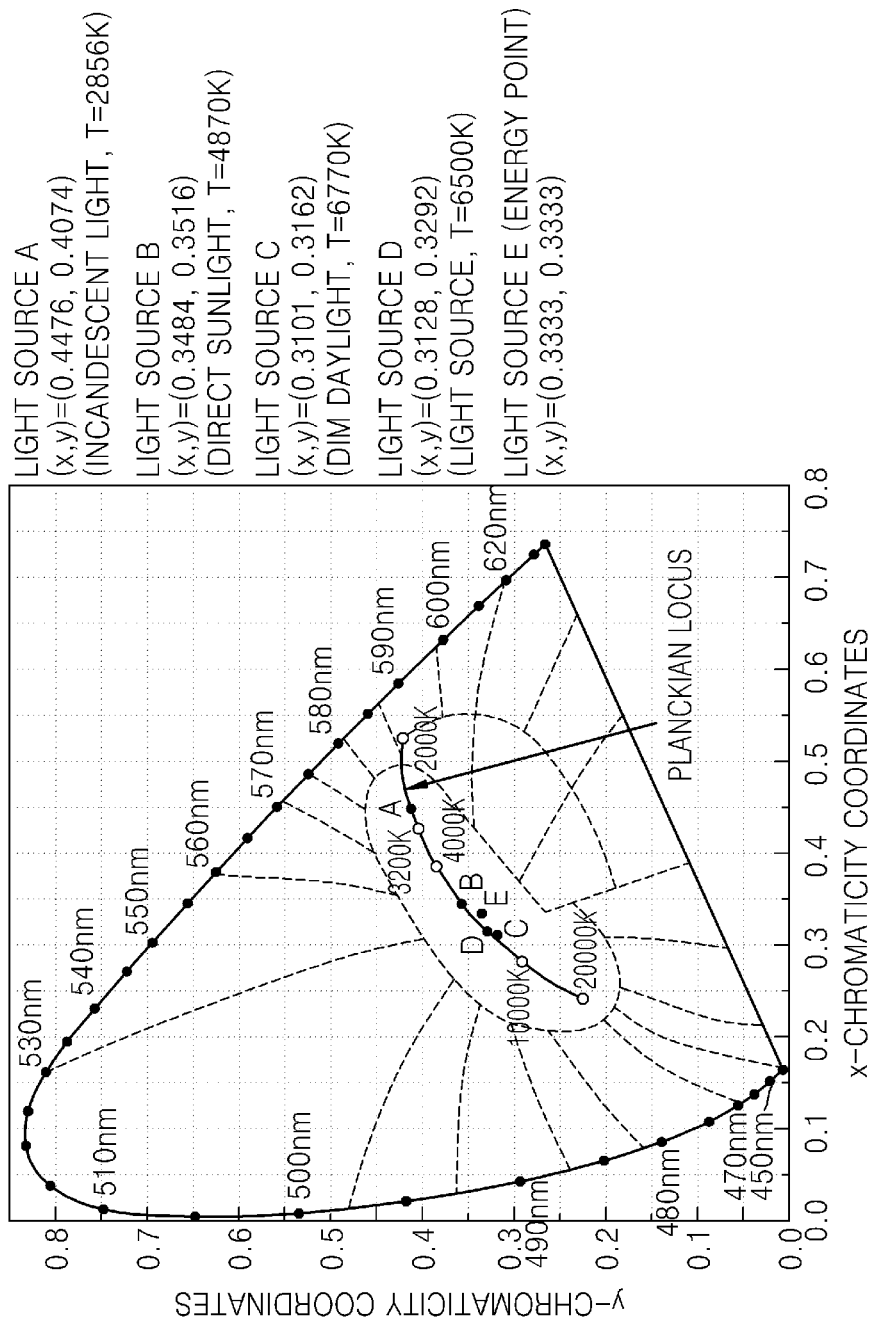
FIG. 10 is an International Commission on Illumination (CIE) chromaticity diagram of a Planckian spectrum.

FIG. 9 is an exploded perspective view of a lamp according to an embodiment of the inventive concept. FIG. 10 is an International Commission on Illumination (CIE) chromaticity diagram of a Planckian spectrum. A lighting apparatus 2100 may include a socket 2190, a power supply 2150, a controller 2130, a heat dissipator 2160, a light source 2140, an optic unit 2170, a communication interface 2110, a non-contact sensor 2120, and a cover 2180.

The socket 2190 may be configured to enable the lighting apparatus 2100 to easily replace and fit into a fixture designed for an existing lighting apparatus. Power may be supplied to the lighting apparatus 2100 via the socket 2190. The power supply 2150 may generate a voltage used in each element of the lighting apparatus 2100 based on power supplied from the outside through the socket 2190.

The heat dissipator 2160 may include an internal heat dissipation unit 2161 and an external heat dissipation unit 2162. The internal heat dissipation unit 2161 may be connected to the light source 2140 and/or the power supply 2150, and may provide a conduit through which heat may be transferred to the external heat dissipation unit 2162.

The light source 2140 may receive power from the power supply 2150 and emit light. The light source 2140 may include one or more light emitting devices C or one or more light emitting device packages 2141, and a circuit substrate 2142.

The optic unit 2170 may be disposed on the light source 2140. The optic unit 2170 may uniformly diffuse light emitted from the light source 2140 to lateral and rear directions so that the lighting apparatus 2100 may emit light to the top and bottom to prevent eyes from being dazzled. The optic unit 2170 may be a reflective plate, a lens, or the like.

The cover 2180 is mounted on the light source 2140 and the optic unit 2170 to protect the light source 2140 and the optic unit 2170 from the outside. A diffusion material may be coated or charged in an inner surface of the cover 2180 so that the light emitted from the light source 2140 may well diffuse through the cover 2180. The cover 2180 may be formed of a transparent plastic material, a glass material, or a translucent plastic material based on polycarbonate (PC), polymethyl methacrytlate (PMMA), acrylic, or the like, and combination of the diffusion material and these transparent materials. The cover 2180 may be formed of a combination of a phosphor and transparent materials so that a color conversion of light emitted from the light source 2140 may be facilitated.

The communication interface 2110 may be mounted on the optic unit 2170 in a module form and may be used to perform network communication. For example, the communication interface 2110 is a wireless communication module using a ZigBee protocol and may control an in-house lighting apparatus such as turning the lamp on/off, adjusting of brightness thereof, or the like by using a smart phone or a wireless lighting controller.

The non-contact sensor 2120 may be mounted on the optic unit 2170 or the communication interface 2110. If a user approaches a magnetic substance near the non-contact sensor 2120, the non-contact sensor 2120 may generate a reset signal and provide the reset signal to the communication interface 2110. The communication interface 2110 may then disconnect the lighting apparatus 2100 from a network in response to the reset signal, search for a new network, and connect the lighting apparatus 2100 to the new network as part of a network reset operation.

A non-contact signal such as a magnetic signal and an electromagnetic wave used in wireless communication may easily transmit through the cover 2180 formed of a plastic material. Thus, the non-contact sensor 2120 and the communication interface 2110 may be disposed on the optic unit 2170 or in a front portion of the light source 2140 as shown in FIG. 9 such that the non-contact signal can be easily detected and the communication interface 2110 can readily communicate wirelessly with an external apparatus. However, the inventive concept is not limited thereto. The non-contact sensor 2120 and the communication interface 2110 may be disposed inside the internal hear dissipation unit 2161. The non-contact sensor 2120 and the communication interface 2110 may be disposed on the circuit substrate 2140 of the light source unit 2140.

Meanwhile, the light emitting device packages 2141 included in the light source 2140 may be similar devices that generate light having the same wavelength. Alternatively, the light emitting device packages 2141 may be dissimilar devices that generate light having different wavelengths from light generated by other ones of the light emitting device packages 2141. For example, the light emitting device packages 2141 may include at least one of a light-emitting device that is combination of a blue-light light emitting device and a phosphor having a color of yellow, green, red, or orange and that emits white light, and a light-emitting device that emits a purple color, a blue color, a green color, a red color, or infrared light. In this case, the lighting apparatus 2100 may adjust a Color Rendering Index (CRI) of a solar level in sodium (Na) and also may generate a variety of white light having color temperatures ranging from 1500° K to 20000° K, and when required, the lighting apparatus may adjust a lighting color according to the ambient atmosphere or mood by generating visible light having a color of purple, blue, green, red, or orange, or infrared light. Also, the lighting apparatus may 2100 generate light having a special wavelength capable of promoting a growth of plants.

White light that corresponds to a combination of the blue-light light emitting device and the yellow, green, and red phosphors and/or green and red light-emitting devices may have at least two peak wavelengths and may be positioned at a line segment connecting (x, y) coordinates (0.4476, 0.4074), (0.3484, 0.3516), (0.3101, 0.3162), (0.3128, 0.3292), and (0.3333, 0.3333) of a CIE 1931 coordinate system of FIG. 10. Alternatively, the white light may be positioned in a region that is surrounded by the line segment and a blackbody radiation spectrum. A color temperature of the white light may be between 2000° K through 20000° K.

Phosphors that are used in a light emitting device may have general formulas and colors as below.

oxide-based phosphors: yellow and green $Y_3Al_5O_{12}$:Ce, $Tb_3Al_5O_{12}$:Ce, $Lu_3Al_5O_{12}$:Ce silicate-based phosphors: yellow and green (Ba, Sr)$_2$SiO$_4$:Eu, yellow and orange (Ba, Sr)$_3$SiO$_5$:Eu nitride-based phosphors: green β-SiAlON:Eu, yellow $L_3Si_6O_{11}$:Ce, orange α-SiAlON:Eu, red CaAlSiN$_3$:Eu, Sr$_2$Si$_5$N$_8$:Eu, SrSiAl$_4$N$_7$:Eu fluoride-based phosphors: KSF based red K$_2$SiF$_6$:Mn4+

Figure 11:
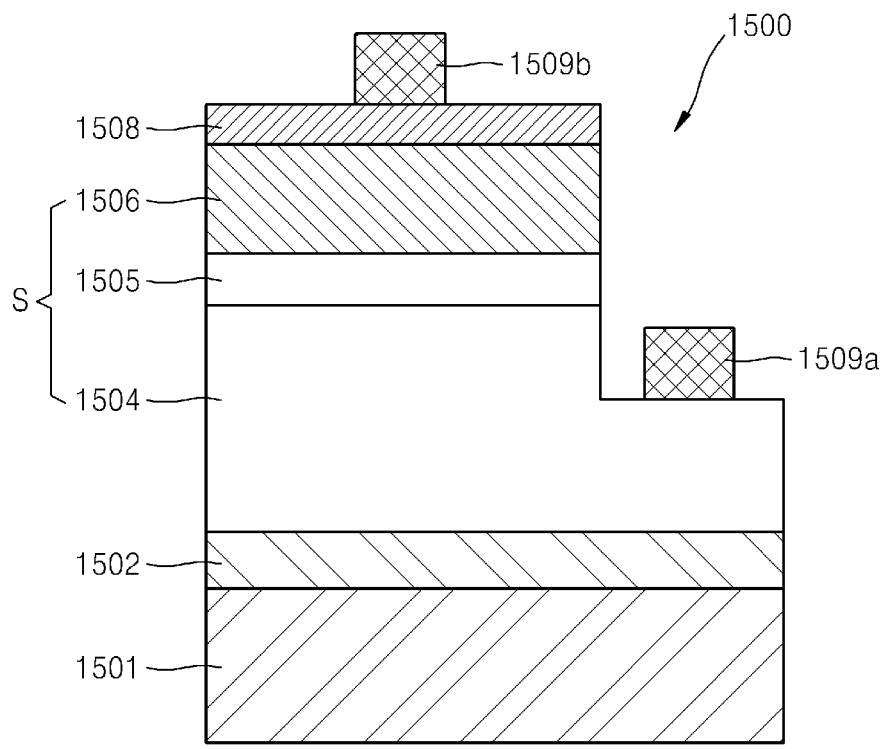
FIG. 11 is a lateral cross sectional view of a light emitting device chip that may be used in a light emitting device of FIG. 9 according to an embodiment of the inventive concept.

FIG. 11 is a lateral cross sectional view of a light emitting device chip 1500 that may be used in a light emitting device C of FIG. 9 according to an embodiment of the inventive concept. As shown in FIG. 11, the light emitting device chip 1500 includes a light emitting stack S formed on a substrate 1501. The light emitting structure S includes a first conductive semiconductor layer 1504, an active layer 1505, and a second conductive semiconductor layer 1506.

The light emitting device chip 1500 includes an ohmic electrode layer 1508 formed on the second conductive semiconductor layer 1506. First and second electrodes 1509a and 1509b are formed on top surfaces of the first conductive semiconductor layer 1504 and the ohmic electrode layer 1508 respectively.

Throughout the specification, terms such as 'upper', 'top surface', 'lower', 'bottom surface', 'side surface', or the like are based on drawings; thus, they may be changed according to a direction in which a device is actually disposed.

Main elements of the light emitting device chip 1500 will now be described in detail below.

An insulating, conductive, or semiconductor substrate may be used as the substrate 1501 according to necessity. For example, the substrate 1501 may be sapphire, SiC, Si, MgAl2O4, MgO, LiAlO2, LiGaO2, or GaN. A sapphire substrate, silicon carbide (SiC) substrate, or the like may be mainly used as a heterogeneous substrate. When the heterogeneous substrate is used, a defect such as dislocation may increase due to a difference in a lattice constant between a substrate material and a thin film material. Due to a difference between thermal expansion coefficients of the substrate material and the thin film material, the substrate 1501 may be bent when a temperature is changed, and the bend causes a crack of a thin film. The problem may be decreased by using a buffer layer 1502 between the substrate 1501 and the light emitting stack S that includes a GaN material.

The buffer layer 1502 may be formed of $Al_xIn_yGa_{1-x-y}N$ ($0 \leq x \leq 1$, $0 \leq y \leq 1$), in particular, GaN, AN, AlGaN, InGaN, or InGaNAlN, and when required, the buffer layer 1502 may be formed of $ZrB_2$, $HfB_2$, ZrN, HfN, TiN, or the like. Also, the buffer layer 1502 may be formed by combining a plurality of layers or by gradually varying composition of one of the materials.

Each of the first and second conductive semiconductor layers 1504 and 1506 may have a single-layer structure. However, when required, each of the first and second conductive semiconductor layers 1504 and 1506 may have a multi-layer structure including a plurality of layers having different compositions or thicknesses. For example, each of the first and second conductive semiconductor layers 1504 and 1506 may have a carrier injection layer capable of improving an efficiency of electron and hole injection, and may also have a superlattice structure having various forms.

The first conductive semiconductor layer 1504 may further include a current diffusion layer (not shown) that is adjacent to the active layer 1505. The current diffusion layer may have a structure in which a plurality of $In_xAl_yGa_{(1-x-y)}N$ layers having different compositions or different impurity ratios are repeatedly stacked, or may be partially formed of an insulation material layer.

The second conductive semiconductor layer 1506 may further include an electron block layer (not shown) that is adjacent to the active layer 1505. The electron block layer may have a structure in which a plurality of $In_xAl_yGa_{(1-x-y)}N$ layers having different compositions are stacked or may have at least one layer formed of $Al_yGa_{(1-y)}N$. Since the electron block layer has a bandgap larger than that of the active layer 1505, the electron block layer prevents electron from entering to the second conductive semiconductor layer 1506 (that is a p-type).

The light emitting stack S is formed by using an metal-organic chemical vapor deposition (MOCVD) apparatus. In more detail, the light emitting device stack S is formed in a manner in which a reaction gas such as an organic metal compound gas (e.g., trimethyl gallium (TMG), trimethyl aluminum (TMA), or the like) and a nitrogen containing gas (e.g. ammonia (NH3), or the like) are injected into a reaction container in which the substrate 1501 is arranged and the substrate 1501 is maintained at a high temperature of about 900 through 1100 degrees, while a gallium-based compound semiconductor is grown on the substrate 1501, if required, an impurity gas is injected, so that the gallium-based compound semiconductor is stacked as an undoped-type, an n-type, or a p-type. Si is well known as n-type impurity. Zn, Cd, Be, Mg, Ca, Ba, or the like, in particular, Mg and Zn, may be used as p-type impurity.

The active layer 1505 that is disposed between the first and second conductive semiconductor layers 1504 and 1506 may have a multi-quantum well (MQW) structure in which a quantum well layer and a quantum barrier layer are alternately stacked. For example, in a case of a nitride semiconductor, the active layer 1505 may have a GaN/InGaN structure. However, in another embodiment, the active layer 1505 may have a single-quantum well (SQW) structure.

The ohmic electrode layer 1508 may decrease an ohmic contact resistance by relatively increasing an impurity density, so that the ohmic electrode layer 1508 may decrease an operating voltage and may improve a device characteristic. The ohmic electrode layer 1508 may be formed of GaN, InGaN, ZnO, or a graphene layer.

The first electrode 1509a or the second electrode 1509b may include a material such as Ag, Ni, Al, Rh, Pd, Jr, Ru, Mg, Zn, Pt, Au, or the like, or may have a multi-layer structure including Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

While the light emitting device chip 1500 shown in FIG. 11 has a structure in which the first electrode 1509a, the second electrode 1509b, and a light extraction surface face the same side, the LED chip 1500 may have various structures such as a flip-chip structure in which the first electrode 1509a and the second electrode 1509b face the opposite side of the light extraction surface, a vertical structure in which the first electrode 1509a and the second electrode 1509b are formed on opposite surfaces, a vertical and horizontal structure employing an electrode structure in which a plurality of vias are formed in a chip so as to increase an efficiency of current distribution and heat dissipation.

Figure 12:
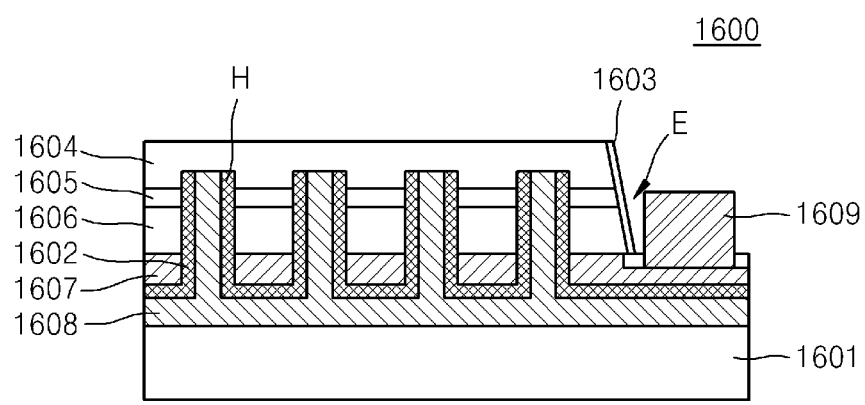
FIG. 12 is a lateral cross sectional view of a light emitting device chip that may be used in the light emitting device of FIG. 9 according to another embodiment of the inventive concept.

FIG. 12 is a lateral cross sectional view of a light emitting device chip 1600 that may be used in the light emitting device C of FIG. 9 according to another embodiment of the inventive concept. The light emitting device chip 1600 of FIG. 12 may be used as a structure useful for increasing an efficiency of current distribution and heat dissipation, when a large area light-emitting device chip for a high output lighting apparatus is manufactured.

Referring to FIG. 12, the light emitting device chip 1600 includes a first conductive semiconductor layer 1604, an active layer 1605, a second conductive semiconductor layer 1606, a second electrode layer 1607, an insulating layer 1602, a first electrode layer 1608, and a substrate 1601 that are sequentially stacked. In this regard, in order to be electrically connected to the first conductive semiconductor layer 1604, the first electrode layer 1608 includes one or more contact holes H that are electrically insulated from the second conductive semiconductor layer 1606 and the active layer 1605 and that extend from a surface of the first electrode layer 1608 to a portion of the first conductive semiconductor layer 1604. In the present embodiment, the first electrode layer 1608 is not an essential element.

The contact hole H extends from an interface of the first electrode layer 1608 to an inner surface of the first conductive semiconductor layer 1604 via the second conductive semiconductor layer 1606 and the active layer 1605. The contact hole H extends to an interface between the active layer 1605 and the first conductive semiconductor layer 1604, and more preferably, the contact hole H extends to the portion of the first conductive semiconductor layer 1604. Since the contact hole H functions to perform electrical connection and current distribution of the first conductive semiconductor layer 1604, the contact hole H achieves its purpose when the contact hole H contacts the first conductive semiconductor layer 1604, thus, it is not required for the contact hole to extend to an outer surface of the first conductive semiconductor layer 1604.

The second electrode layer 1607 that is formed on the second conductive semiconductor layer 1606 may be formed of a material selected from the group consisting of Ag, Ni, Al, Rh, Pd, Ir, Ru, Mg, Zn, Pt, and Au, in consideration of a light reflection function and an ohmic contact with the second conductive semiconductor layer 1606, and may be formed via a sputtering process or a deposition process.

The contact hole H has a shape that penetrates through the second electrode layer 1607, the second conductive semiconductor layer 1606, and the active layer 1605 so as to be connected with the first conductive semiconductor layer 1604. The contact hole H may be formed via an etching process using ICP-RIE or the like.

The insulating layer 1602 is formed to cover side walls of the contact hole H and a top surface of the second conductive semiconductor layer 1606. In this case, a portion of the first conductive semiconductor layer 1604 that corresponds to a bottom surface of the contact hole H may be exposed. The insulating layer 1602 may be formed by depositing an insulation material such as $SiO_2$, SiOxNy, SixNy, or the like. The insulating layer 1602 may be deposited at a thickness range from about 0.01~about 3 μm at 500° C. or below through a CVD process.

The second electrode layer 1607 that includes a conductive via formed by filling a conductive material is formed in the contact hole H. A plurality of vias may be formed in one light emitting device region. The number of the vias and contact areas may be adjusted only when an area of the vias on a plane of a region in which the vias and the first conductive semiconductor layer 1604 contact each other is within a range from about 1%~5% of an area of the light emitting device. A radius of the vias on the plane of the region in which the vias and the first conductive semiconductor layer 1604 contact each other may have a range, for example, from about 5 μm~about 50 μm. The number of the vias may have a range from about 1~about 50 for each light emitting device region according to a size of the light emitting device region. Although the vias vary according to the size of the light emitting device region, the number of the vias may be 3 or more. Distances between the vias may have a matrix structure having rows and columns in a range from about 100 μm and about 500 μm, and may be in a range from about 150 μm and about 450 μm. If the distances between the vias are smaller than 100 μm, the number of the vias increases, and a light emitting area relatively decreases, whereas if the distances between the vias are greater than 100 μm, a current diffusion becomes difficult, which reduces emission efficiency. A depth of the via may vary according to thicknesses of the active layer 1605 and the second conductive semiconductor layer 1606 and may be a range from about 0.5 μm~about 5.0 μm.

Thereafter, the substrate 1601 is formed on the first electrode layer 1608. In this structure, the substrate 1601 may be electrically connected to the first conductive semiconductor layer 1604 via the conductive via that contacts the first conductive semiconductor layer 1604.

The substrate 1601 may be formed of, but is not limited to, a material selected from the group consisting of Au, Ni, Al, Cu, W, Si, Se, GaAs, SiAl, Ge, SiC, AN, $Al_2O_3$, GaN, and AlGaN, via a plating process, a sputtering process, a deposition process, or an adhesion process.

In order to decrease a contact resistance of the contact hole H, a total number of the contact holes H, a shape of the contact hole H, a pitch of the contact hole H, a contact area of the contact hole H with respect to the first and second conductive semiconductor layers 1604 and 1606, or the like may be appropriately adjusted, and since the contact holes H are arrayed in various forms along lines and columns, a current flow may be improved.

It is preferable to apply a light emitting device chip having a small calorific value to the lighting apparatus, in consideration of a total heat dissipation performance. An example of the light emitting device chip having a small calorific value may be an light emitting device chip having a nano structure (hereinafter, referred to as a "nano light emitting device chip").

An example of the nano light emitting device chip includes a core-shell type nano light emitting device chip that has recently been developed. The core-shell type nano light emitting device chip generates a relatively small amount of heat due to its small combined density, and increases its light emitting area by using the nano structure so as to increase emission efficiency. Also, the core-shell type nano light emitting device chip may obtain a non-polar active layer, thereby preventing efficiency deterioration due to polarization, so that a drop characteristic may be improved.

Figure 13:
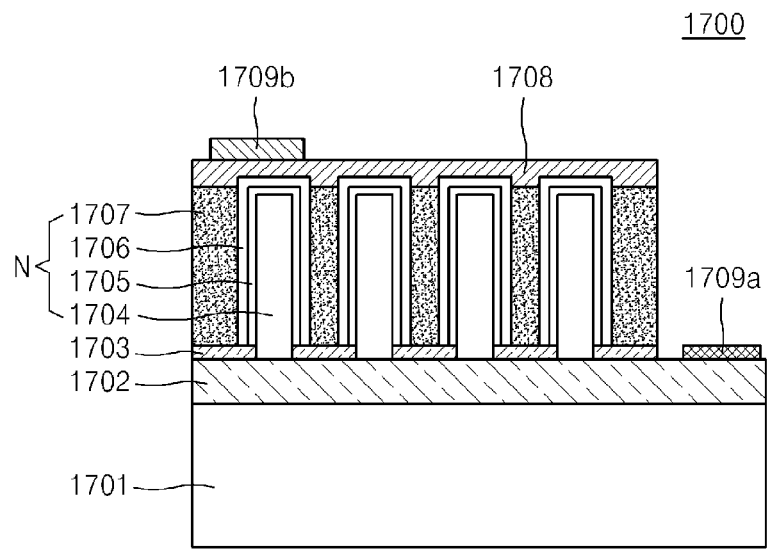
FIG. 13 is a lateral cross sectional view of a light emitting device chip that may be used in the light emitting device of FIG. 9 according to another embodiment of the inventive concept.

FIG. 13 is a lateral cross sectional view of a nano light emitting device chip 1700 that may be used in the light emitting device C of FIG. 9 according to another embodiment of the inventive concept. As shown in FIG. 13, the nano light emitting device chip 1700 includes a plurality of nano emission structures (not shown) that are formed on a substrate 1701. In the present embodiment, the nano emission structure N has a rod structure as a core-shell structure, but in another embodiment, the nano light emitting structure N may have a different structure such as a pyramid structure.

The nano light emitting device chip 1700 includes a base layer 1702 formed on the substrate 1701. The base layer 1702 may be a layer to provide a growth surface for the nano emission structures N and may be formed of a first conductive semiconductor. A mask layer 1703 having open areas for a growth of the nano light emitting structures N (in particular, a core) may be formed on the base layer 1702. The mask layer 1703 may be formed of a dielectric material such as $SiO_2$ or SiNx.

In the nano light emitting structure N, a first conductive nano core 1704 is formed by selectively growing the first conductive semiconductor by using the mask layer 1703 having open areas, and an active layer 1705 and a second conductive semiconductor layer 1706 are formed as a shell layer on a surface of the first conductive nano core 1704. By doing so, the nano emission structure N may have a core-shell structure in which the first conductive semiconductor is a nano core, and the active layer 1705 and the second conductive semiconductor layer 1706 that surround the nano core are the shell layer.

In the present embodiment, the nano light emitting device chip 1700 includes a filling material 1707 that fills gaps between the nano light emitting structures N. The filling material 1707 may structurally stabilize the nano light emitting structures N. The filling material 1707 may include, but is not limited to, a transparent material such as $SiO_2$. An ohmic contact layer 1708 may be formed on the nano light emitting structure N so as to contact the second conductive semiconductor layer 1706. The nano light emitting device chip 1700 includes first and second electrodes 1709a and 1709b that contact the base layer 1702, which is formed of the first conductive semiconductor, and the ohmic contact layer 1708, respectively.

By varying a diameter, a component, or a doping density of the nano light emitting structure N, light having at least two different wavelengths may be emitted from one device. By appropriately adjusting the light having the different wavelengths, white light may be realized in the one device without using a phosphor. In addition, by combining the one device with another light emitting chip or combining the one device with a wavelength conversion material such as a phosphor, light having desired various colors or white light having different color temperatures may be realized.

Figure 14:
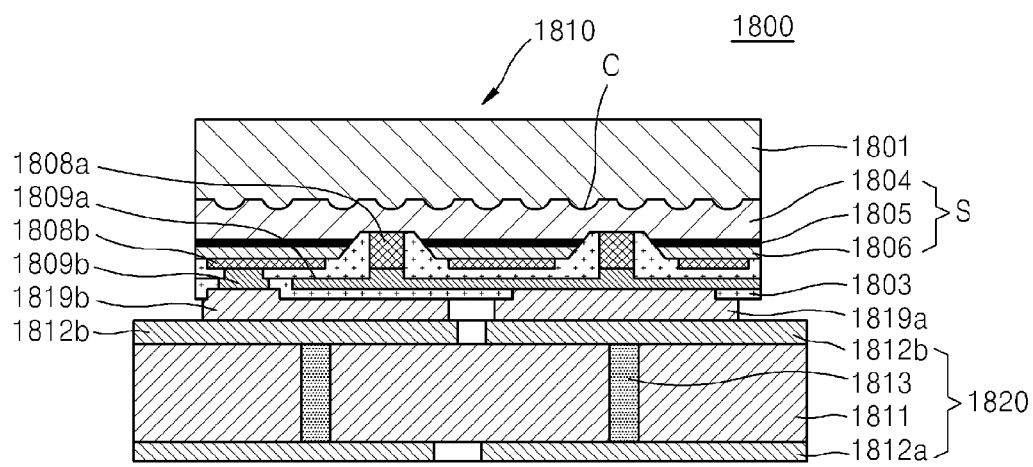
FIG. 14 is a lateral cross sectional view of a light emitting device including a light emitting device chip that is mounted on a substrate and may be used in the light emitting device of FIG. 9 according to an embodiment of the inventive concept.

FIG. 14 is a lateral cross sectional view of a semiconductor light emitting device 1800 including a light emitting device chip that is mounted on a mounting substrate and may be used in the light emitting device C of FIG. 9 according to an embodiment of the inventive concept. The semiconductor light emitting device 1800 of FIG. 14 includes the mounting substrate 1820 and the light emitting device chip 1810 that is mounted on the mounting substrate 1820. The light emitting device chip 1810 is different from the light emitting device chips in the aforementioned embodiments.

The light emitting device chip 1810 includes an emission stack S that is disposed on a surface of the substrate 1801, and first and second electrodes 1808a and 1808b that are disposed on a surface of the emission stack S opposite to the substrate 1801. Also, the light emitting device chip 1810 includes an insulation unit 1803 to cover the first and second electrodes 1808a and 1808b.

The first and second electrodes 1808a and 1808b may include first and second electrode pads 1819a and 1819b via first and second electric power connection units 1809a and 1809b.

The emission stack S may include a first conductive semiconductor layer 1804, an active layer 1805, and a second conductive semiconductor layer 1806 that are sequentially disposed on the substrate 1801. The first electrode 1808a may be provided as a conductive via that contacts the first conductive semiconductor layer 1804 by penetrating through the second conductive semiconductor layer 1806 and the active layer 1805. The second electrode 1808b may contact the second conductive semiconductor layer 1806. A plurality of vias may be formed in one light emitting device region. The number of the vias and contact areas may be adjusted only when an area of the vias on a plane of a region in which the vias and the first conductive semiconductor layer 1804 contact each other is within a range from about 1%~5% of an area of the light emitting device. A radius of the vias on the plane of the region in which the vias and the first conductive semiconductor layer 1804 contact each other may have a range, for example, from about 5 µm~about 50 µm. The number of the vias may have a range from about 1~about 50 for each light emitting device region according to a size of the light emitting device region. Although the vias vary according to the size of the light emitting device region, the number of the vias may be 3 or more. Distances between the vias may have a matrix structure having rows and columns in a range from about 100 µm and about 500 µm, and may be in a range from about 150 µm and about 450 µm. If the distances between the vias are smaller than 100 µm, the number of the vias increases, and a light emitting area relatively decreases, whereas if the distances between the vias are greater than 100 µm, a current diffusion becomes difficult, which reduces emission efficiency. A depth of the via may vary according to thicknesses of the active layer 1605 and the second conductive semiconductor layer 1606 and may be a range from about 0.5 µm~about 5.0 µm.

The first and second electrodes 1808a and 1808b may be formed by depositing a conductive ohmic material on the emission stack S. The first and second electrodes 1808a and 1808b may be electrodes including at least one of Ag, Al, Ni, Cr, Cu, Au, Pd, Pt, Sn, Ti, W, Rh, Ir, Ru, Mg, Zn or an alloy including these materials. For example, the second electrode 1808b is formed by depositing an ohmic electrode of an Ag layer with respect to the second conductive semiconductor layer 1806. The Ag ohmic electrode acts as a light reflective layer. Single layers of Ni, Ti, Pt, and W or an alloy layer of these layers may be selectively deposited alternately on the Ag layer. In more detail, a Ni/Ti layer, a Ti/Pt layer, or a Ti/W layer may be deposited or these layers may be alternately disposed below the Ag layer.

The first electrode 1808a is formed by depositing a Cr layer with respect to the first conductive semiconductor layer 1804, sequentially stacking Au/Pt/Ti layers on the Cr layer or depositing an Al layer with respect to the second conductive semiconductor layer 1806 and sequentially stacking Ti/Ni/Au layers on the Al layer.

The first and second electrodes 1808a and 1808b may apply various materials or stack structures so as to increase an ohmic or reflection characteristic in addition to the embodiment.

The insulation unit 1803 may have an open area to expose a portion of the first and second electrodes 1808a and 1808b, and the first and second electrode pads 1819a and 1819b may contact the first and second electrodes 1808a and 1808b. The insulating layer 1803 may be deposited at a thickness range from about 0.01~about 3 µm at 500° C. or below through a SiO2 and/or SiN CVD process.

The first and second electrodes 1808a and 1808b may be disposed in the same direction, and as will be described later, the first and second electrodes 1808a and 1808b may be mounted in the form of a flip-chip in a lead frame. In this case, the first and second electrodes 1808a and 1808b may be disposed to face in the same direction.

In particular, a first electric power connection unit 1809a may be formed by the first electrode 1808a, namely, by the conductive via that penetrates through the active layer 1805 and the second conductive semiconductor layer 1806 and then is connected to the first conductive semiconductor layer 1804 in the emission stack S.

In order to decrease a contact resistance between the conductive via and the first electric power connection unit 1809a, a total number, shapes, pitches, a contact area with the first conductive semiconductor layer 1804, or the like of the conductive via and the first electric power connection unit 1809a may be appropriately adjusted, and since the conductive via and the first electric power connection unit 1809a are arrayed in rows and columns, a current flow may be improved.

An electrode structure of the other side of the semiconductor light-emitting device 1800 may include the second electrode 1808*b* that is directly formed on the second conductive semiconductor layer 1806, and the second electric power connection unit 1809*b* that is formed on the second electrode 1808*b*. The second electrode 1808*b* may function to form an electrical ohmic connection with the second electric power connection unit 1809*b* and may be formed of a light reflection material, so that, when the light emitting device chip 1810 is mounted as a flip-chip structure as illustrated in FIG. 14, the second electrode 1808*b* may efficiently discharge light, which is emitted from the active layer 1805, toward the substrate 1801. Obviously, according to a major light emission direction, the second electrode 1808*b* may be formed of a light-transmitting conductive material such as transparent conductive oxide.

The aforementioned two electrode structures may be electrically separated from each other by using the insulation unit 1803. Any material or any object having an electrical insulation property may be used as the insulation unit 1803, but it is preferable to use a material having a low light-absorption property. For example, silicon oxide or silicon nitride such as $SiO_2$, $SiOxNy$, $SixNy$ or the like may be used. When required, the insulation unit 1803 may have a light reflection structure in which a light reflective filler is distributed throughout a light transmitting material.

The first and second electrode pads 1819*a* and 1819*b* may be connected to the first and second electric power connection units 1809*a* and 1809*b*, respectively, and thus may function as external terminals of the light emitting device chip 1810. For example, the first and second electrode pads 1819*a* and 1819*b* may be formed of Au, Ag, Al, Ti, W, Cu, Sn, Ni, Pt, Cr, NiSn, TiW, AuSn, or a eutectic alloy thereof. In this case, when the first and second electrode pads 1819*a* and 1819*b* are mounted on the mounting substrate 1820, the first and second electrode pads 1819*a* and 1819*b* may be bonded to mounting substrate 1820 by using eutectic metal, so that a separate solder bump that is generally used in flip-chip bonding may not be used. Compared to a case of using the solder bump, the mounting method using the eutectic metal may achieve a more excellent heat dissipation effect. In this case, in order to obtain the excellent heat dissipation effect, the first and second electrode pads 1819*a* and 1819*b* may be formed while having large areas.

The substrate 1801 and the emission stack S may be understood by referring to the description with reference to FIG. 11, unless contrary description is provided. Also, although not particularly illustrated in FIG. 14, a buffer layer (not shown) may be formed between the light emitting stack S and the substrate 1801, and in this regard, the buffer layer may be formed as a undoped semiconductor layer including nitride or the like, so that the buffer layer may decrease a lattice defect of an emission structure that is grown on the buffer layer.

The substrate 1801 may have first and second primary surfaces that face each other, and in this regard, a convex-concave structure may be formed on at least one of the first and second primary surfaces. The convex-concave structure that is arranged on one surface of the substrate 1801 may be formed of the same material as the substrate 1801 since a portion of the substrate 1801 is etched, or may be formed of a different material from the substrate 1801.

As in the present embodiment, since the convex-concave structure is formed at an interface between the substrate 1801 and the first conductive semiconductor layer 1804, a path of light emitted from the active layer 1805 may vary, such that a rate of light that is absorbed in the semiconductor layer may be decreased and a light-scattering rate may be increased; thus, the light extraction efficiency may be increased.

In more detail, the convex-concave structure may have a regular shape or an irregular shape. Heterogeneous materials that form the convex-concave structure may include a transparent conductor, a transparent insulator, or a material having excellent reflectivity, and in this regard, the transparent insulator may include, but is not limited to, $SiO_2$, $SiNx$, $Al_2O_3$, $HfO$, $TiO_2$ or $ZrO$, the transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn, and the reflective material may include, but is not limited to, Ag, Al, or DBR that is formed of a plurality of layers having different refractive indexes.

The substrate 1801 may be removed from the first conductive semiconductor layer 1804. In order to remove the substrate 1801, a laser lift off (LLO) process using a laser, an etching process, or a grinding process may be performed. After the substrate 1801 is removed, the convex-concave structure may be formed on a top surface of the first conductive semiconductor layer 1804.

As illustrated in FIG. 14, the light emitting device chip 1810 is mounted on the mounting substrate 1820. The mounting substrate 1820 has a structure in which upper and lower electrode layers 1812*b* and 1812*a* are formed on a top surface and a bottom surface of a substrate body 1811, respectively, and a via 1813 penetrates through the substrate body 1811 so as to connect the upper and lower electrode layers 1812*b* and 1812*a*. The substrate body 1811 may be formed of resin, ceramic, or metal, and the upper and lower electrode layers 1812*b* and 1812*a* may be metal layers including Au, Cu, Ag, Al, or the like.

Obviously, an example of a substrate on which the light emitting device chip 1810 is mounted is not limited to the mounting substrate 1820 of FIG. 14, and thus any substrate having a wiring structure to drive the light emitting device chip 1810 may be used. For example, it is possible to provide a package structure in which the light emitting device chip 1810 is mounted in a package body having a pair of lead frames.

A light emitting device chip having one of various structures may be used, other than the light emitting device chips. For example, it is possible to use a light emitting device chip having a light extraction efficiency that is significantly improved by interacting a quantum well exciton and surface-plasmon polaritons (SPP) formed at an interface between metal and dielectric layers of the light emitting device chip.

The various light emitting device chips may be mounted as bare chips on a circuit board and then may be used in the lighting apparatus. However, unlike this, the light emitting device chips may be also alternatively used in various package structures that are mounted in a package body having a pair of electrodes.

A package including the light emitting device chip (hereinafter, referred to as an light emitting device package) may have not only an external terminal structure that is easily connected to an external circuit but also may have a heat dissipation structure for improvement of a heat dissipation characteristic of the light emitting device chip and various optical structures for improvement of a light characteristic of the light emitting device chip. For example, the various optical structures may include a wavelength conversion unit that converts light emitted from the light emitting device chip into light having a different wavelength, or may include a lens structure for improvement of a light distribution characteristic of the light emitting device chip.

The example of the light emitting device package that may be used in the lighting apparatus may include a light emitting device chip package having a CSP structure.

The CSP may reduce a size of the light emitting device chip package, may simplify the manufacturing procedure, and may be appropriate for mass production. In addition, a light emitting device chip, wavelength conversion materials such as phosphors, and an optical structure such as a lens may be integrally manufactured, so that the CSP may be designed as appropriate for the lighting apparatus.

Figure 15:
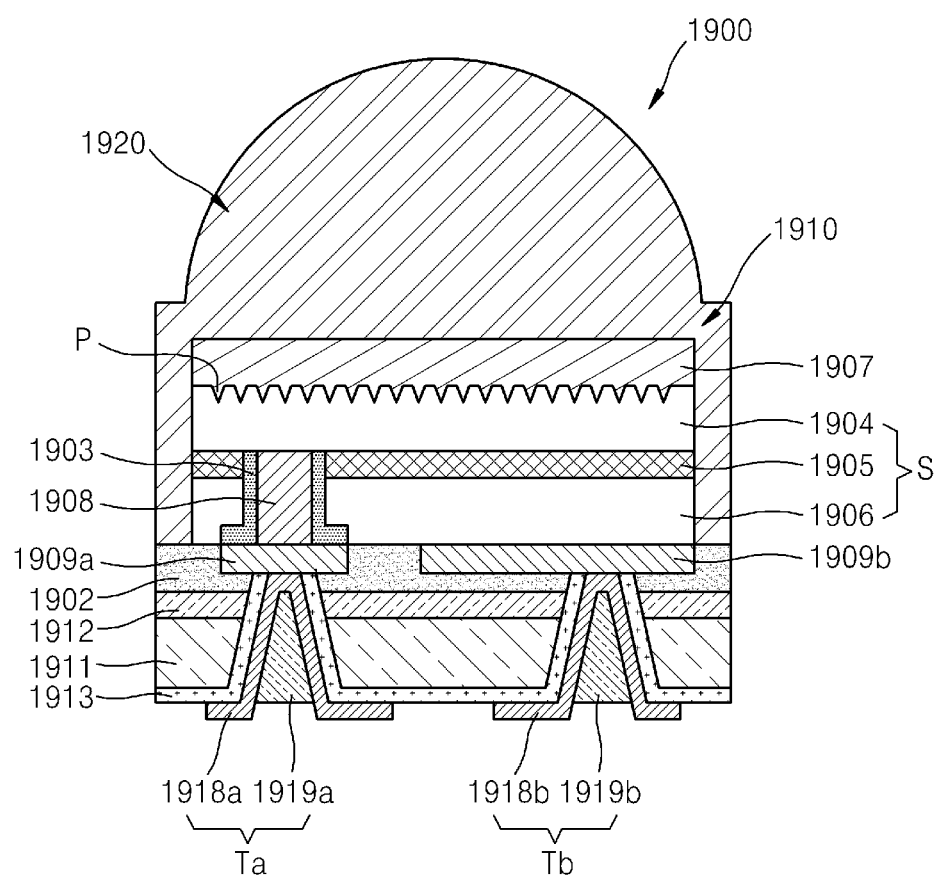
FIG. 15 is a lateral cross sectional view of a light emitting device package that may be used in a light source of FIG. 9 according to an embodiment of the inventive concept.

FIG. 15 is a lateral cross sectional view of a light emitting device package that may be used in a light source of FIG. 9 according to an embodiment of the inventive concept. FIG. 15 illustrates an example of a CSP that has a package structure in which an electrode is formed via a bottom surface of a light emitting device 1910 that is in an opposite direction of a primary light extraction surface, and a phosphor layer 1907 and a lens 1920 are integrally formed, according to an embodiment of the inventive concept.

A CSP 1900 shown in FIG. 15 includes a light emitting device stack S disposed on a mounting substrate 1911, first and second terminals Ta and Tb, the phosphor layer 1907, and the lens 1920.

The light emitting device stack S has a stack structure including first and second semiconductor layers 1904 and 1906, and an active layer 1905 disposed between the first and second semiconductor layers 1904 and 1906. In the present embodiment, the first and second semiconductor layers 1904 and 1906 may be p-type and n-type semiconductor layers, respectively, and may be formed of a nitride semiconductor such as AlxInyGa(1-x-y)N (0≤x≤1, 0≤y≤1, 0≤x+y≤1). Alternatively, the first and second semiconductor layers 1904 and 1906 may be formed of a GaAs-based semiconductor or a GaP-based semiconductor, other than the nitride semiconductor.

The active layer 1905 that is disposed between the first and second semiconductor layers 1904 and 1906 may emit light that has a predetermined energy due to recombination of electrons and holes and may have a MQW structure in which a quantum well layer and a quantum barrier layer are alternately stacked. The MQW structure may include an InGaN/GaN structure or a AlGaN/GaN structure.

The first and second semiconductor layers 1904 and 1906, and the active layer 1905 may be formed via a semiconductor layer growing procedure such as MOCVD, MBE, HVPE, or the like that is well known in the art.

In the light emitting device 1910 shown in FIG. 15, a growth substrate is already removed, and a concave-convex structure P may be formed on a surface of the light emitting device 1910 from which the growth substrate is removed. Also, the phosphor layer 1907 is formed as a light conversion layer on the surface whereon the concave-convex structure P is formed.

The light emitting device 1910 has first and second electrodes 1909a and 1909b that contact the first and second semiconductor layers 1904 and 1906, respectively. The first electrode 1909a has a conductive via 1908 that contacts the first semiconductor layer 1904 by penetrating through the second semiconductor layer 1906 and the active layer 1905. The conductive via 1908 has an insulating layer 1903 formed between the active layer 1905 and the second semiconductor layer 1906, thereby preventing a short.

Referring to FIG. 15, one conductive via 1908 is arranged, but in another embodiment, at least two conductive vias 1908 may be arranged for improved current distribution and may be arrayed in various forms.

The mounting substrate 1911 is a supporting substrate such as a silicon substrate to be easily applied to a semiconductor procedure, but examples of the mounting substrate 1911 may vary. The mounting substrate 1911 and the light emitting device 1910 may be bonded to each other via bonding layers 1902 and 1912. The bonding layers 1902 and 1912 may be formed of an electrical insulation material or an electrical conduction material, and in this regard, examples of the electrical insulation material may include oxide such as $SiO_2$, SiN, or the like, or resin materials including a silicon resin, an epoxy resin, or the like, and examples of the electrical conduction material may include Ag, Al, Ti, W, Cu, Sn, Ni, Pt, Cr, NiSn, TiW, AuSn, or a eutectic metal thereof. The bonding process may be performed in a manner in which the bonding layers 1902 and 1912 are arranged on bonding surfaces of the light emitting device 1910 and the mounting substrate 1911 and then are bonded together.

A via that penetrates through the mounting substrate 1911 is formed at a bottom surface of the mounting substrate 1911 so as to contact the first and second electrodes 1909a and 1909b of the bonded light emitting device 1910. Then, an insulator 1913 may be formed on a side surface of the via and the bottom surface of the mounting substrate 1911. When the mounting substrate 1911 is formed as a silicon substrate, the insulator 1913 may be arranged as a silicon oxide layer that is formed via a thermal oxidation procedure. By filling the via with a conductive material, the first and second terminals Ta and Tb are formed to be connected to the first and second electrodes 1909a and 1909b. The first and second terminals Ta and Tb may include seed layers 1918a and 1918b, and plating charging units 1919a and 1919b that are formed by using the seed layers 1918a and 1918b via a plating procedure.

Figure 16:
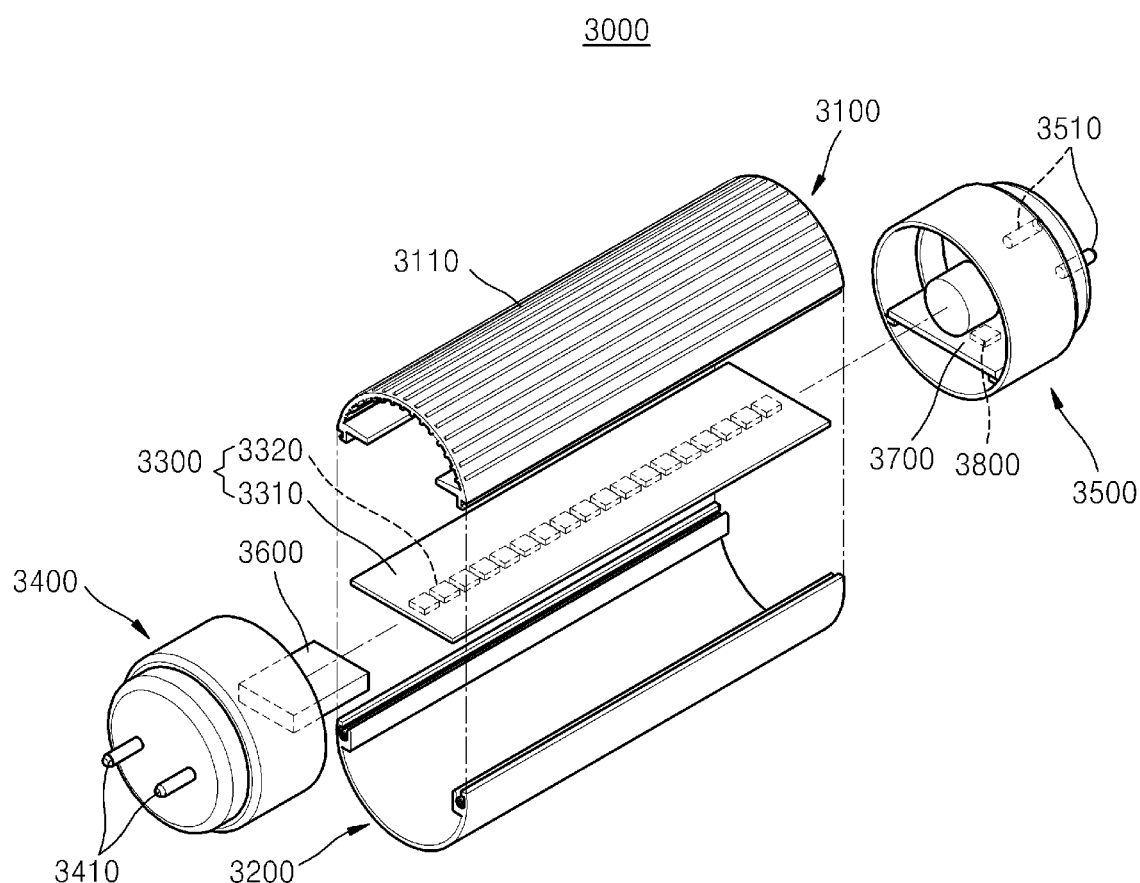
FIG. 16 is an exploded perspective view of an L tubular lighting apparatus according to the embodiment of the inventive concept.

FIG. 16 is an exploded perspective view of an L tubular lighting apparatus 3000 according to the embodiment of the inventive concept. Referring to FIG. 16, the L tubular lighting apparatus 3000 includes a heat dissipator 3100, a cover 3200, a light emitting module 3300, a first socket 3400, a second socket 3500, a power supply 3600, a communication interface 3700, and a non-contact sensor 3800.

The L tubular lighting apparatus 3000 is an LED lighting apparatus that replaces an existing fluorescent lamp and may have the same size as that of the existing fluorescent lamp.

A plurality of heat dissipation pins 3110 may be formed in a concave-convex structure on inner and/or outer surfaces of the heat dissipation member 3100, and in this regard, it is possible to design the heat dissipation pins 3100 to have various shapes and intervals.

A diffusion material may be coated or charged in an inner surface of the cover 3200 so that light emitted from the light emitting module 3300 may well diffuse. The cover 3200 may be formed of a transparent plastic material, a glass material, or a translucent plastic material.

The light emitting module 3300 may include a PCB 3310 and a light emitting device array 3320. The PCB 33101 may include circuit wirings to operate the light emitting device array 3320. Configuration elements to operate the light emitting device array 3320 may be included in the PCB 3310.

The first and second sockets 3400 and 3500 are a pair of sockets and are combined with ends of the cylindrical cover unit that is formed of the heat dissipation member 3100 and the cover 3200.

For example, the first socket 3400 may include an electrode terminal 3410 and the power supply unit 3600. A dummy terminal 3510 may be disposed at the second socket 3500.

The power supply unit 3600 receives AC power (of from about 100V~about 240V) and supplies AC or DC power suitable for a LED light source. The power supply unit 3600 may be integrated with the PCB 3310 or may be separated from another circuit substrate.

The communication interface 3700 and the non-contact sensor 3800 may be embedded in the second socket 3500. The L tubular lighting apparatus 3000 may be connected to an external network via the communication interface 3700 to communicate with an external apparatus. The L tubular lighting apparatus 3000 may be controlled via wireless or wired communication. A user may apply an external signal such as a magnetic signal to the non-contact sensor 3800 such that the network may be reset.

Figure 17:
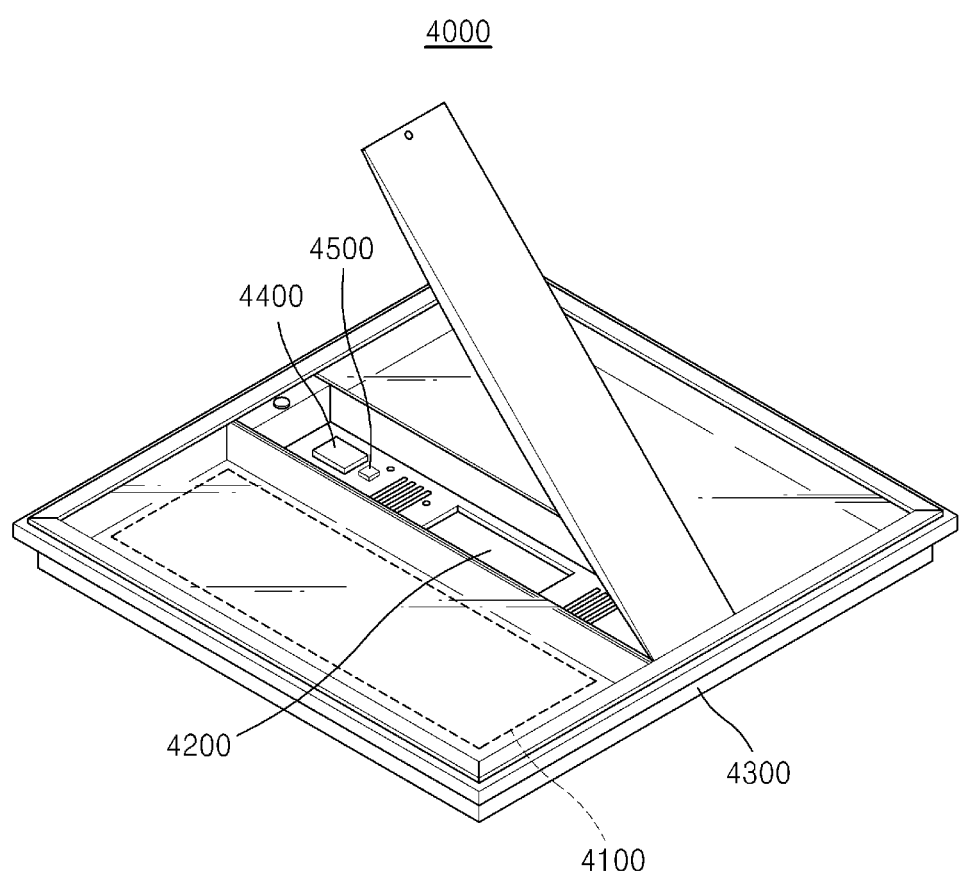
FIG. 17 is a schematic view of a flat panel lighting apparatus according to the embodiment of the inventive concept.

FIG. 17 is a schematic view of a flat panel lighting apparatus 4000 according to the embodiment of the inventive concept. The flat lighting apparatus 4000 may include a light source 4100, a power supply 4200, a housing 4300, a communication interface 4400, and a non-contact sensor 4500.

The light source 4100 may form generally a planar shape as shown in FIG. 17. The power supply 4200 may be configured to supply power to the light source 4100.

The flat panel lighting apparatus 4000 may be connected to a network via the communication interface 4400 and may be controlled via wireless or wired communication. When the network is necessarily reset, a user may apply a magnetic signal to the non-contact sensor 4500. Thus, the non-contact sensor 4500 may generate a reset signal, and then the communication interface 4400 may reset the network in response to the reset signal.

The housing 4300 may be formed to have a space for accommodating the light source 4100, the power supply 4200, the communication interface 4400, and the non-contact sensor 4500, and may have an open hexahedral shape but is not limited thereto. The light source 4100 may be disposed to emit light in one open side surface of the housing 4300. The non-contact sensor 4500 is accommodated in the housing 4300 in the present embodiment but is not limited thereto. The non-contact sensor 4500 may be mounted outside the housing 4300.

FIG. 18 illustrates a home network to which a lamp is applied according to an embodiment of the inventive concept. The home network provides the ability to connect electric home appliances via a wired or wireless network and mutually control the home appliances via the network, the Internet, and data sharing. Electric home appliances capable of wireless communication such as a wireless lighting apparatus 5100, a TV 5200, a wireless door lock 5300, a home appliance 5400, a smart phone 5500, a home wireless router 5600, a wall switch 5700, or the like are connected to a gateway 6000 to form a network and mutually control the electric home appliances. As in-house wireless communication protocols, ZigBee, WiFi, Bluetooth, or the like may be used. Brightness of the wireless lighting apparatus 5100 may be automatically adjusted according to operating statuses of a sensor located on a porch, the wall switch 5700, a home appliance, or the like, and ambient environments/situations.

For example, the brightness of the wireless lighting apparatus 5100 may be automatically adjusted according to a type of a program broadcasted on the TV 5200 or brightness of a screen of the TV 5200. When a cozy atmosphere is required due to broadcasting of human drama, brightness may be adjusted to have a color temperature equal to or less than 12000° K according to the cozy atmosphere. When a light atmosphere is required due to broadcasting of a comedy program, brightness may be adjusted to have a color temperature equal to or greater than 12000° K and may have a blue-based white color.

While the inventive concept has been particularly shown and described with reference to exemplary embodiments thereof, it will be understood that various changes in form and details may be made therein without departing from the spirit and scope of the following claims.

What is claimed is:

1. A lighting apparatus comprising:
   a light source configured to emit light;
   a controller configured to control operation of the light source in response to an external control signal;
   a non-contact sensor configured to detect a non-contact signal; and
   a communication interface configured to communicatively connect the lighting apparatus to a wireless network to receive the external control signal from a remote apparatus via the wireless network,
   wherein the controller turns the light source on/off or changes at least one of a color temperature, chroma, or brightness of the light emitted from the light source in response to the external control signal,
   wherein the light source comprises:
     a circuit substrate; and
     one or more light emitting devices that are disposed on the circuit substrate,
   wherein the one or more light emitting devices comprise a phosphor, a first conductive semiconductor layer, an active layer, a second conductive semiconductor layer, a second electrode layer, an insulating layer, and a first electrode layer that are sequentially stacked,
   wherein the first electrode layer comprises one or more contacts that are electrically insulated from the second conductive semiconductor layer and the active layer and that extend from a surface of the first electrode layer to a portion of the first conductive semiconductor layer in order to be electrically connected to the first conductive semiconductor layer, and the phosphor generates a white light having a color temperature in a range from 1500° K to 20000°, and
   wherein the communication interface comprises:
     an interface unit configured to communicate with the remote apparatus via the wireless network by using a predetermined communication protocol;
     a network setting unit configured to control the interface unit to connect to or disconnect from the wireless network; and
     a memory configured to store network data related to the wireless network.

2. The lighting apparatus of claim 1, wherein the non-contact sensor comprises at least one of a Hall sensor, a proximity sensor, or a magnetic resistance sensor.

3. The lighting apparatus of claim 1, wherein the non-contact sensor detects an approach of a magnetic substance to the lighting apparatus as the non-contact signal.

4. The lighting apparatus of claim 1, wherein the network setting unit deletes the network data related to the wireless network stored in the memory in response to receiving a reset signal from the non-contact sensor, and controls the interface unit to search for a new network.

5. The lighting apparatus of claim 1, wherein the non-contact sensor generates a first reset signal when a polarity of an approaching magnetic substance is an N electrode, and generates a second reset signal different from the first reset signal when the polarity of an approaching magnetic substance is an S electrode.

6. The lighting apparatus of claim 5, wherein the communication interface disconnects the lighting apparatus from the wireless network and operates in a first reset mode to reconnect the lighting apparatus to the wireless network in response to receiving the first reset signal from the non-contact sensor, and disconnects the lighting apparatus from the wireless network and operates in a second reset mode to connect the lighting apparatus to another wireless network in response to receiving the second reset signal from the non-contact sensor.

7. The lighting apparatus of claim 1, wherein the second electrode layer comprises at least three vias, distances between the vias have a matrix structure having rows and columns in a range from about 100 μm to about 500 μm, and depths of the vias are in a range from about 0.5 μm to about 5.0 μm.

8. The lighting apparatus of claim 1, wherein the one or more light emitting devices comprise nano light emitting structures.

9. The lighting apparatus of claim 1, wherein the wireless network operates according to a ZigBee protocol.

10. A lighting control system comprising:
  a lighting apparatus according to claim 1;
  a lighting controller configured to generate the external control signal; and
  a relay configured to receive the external control signal from the lighting controller and provide the external control signal to the lighting apparatus.

11. The lighting control system of claim 10, wherein the lighting apparatus and the relay are configured to transmit or receive a signal between each other using a same wireless communication protocol, and the lighting controller and the relay are each configured to transmit or receive a signal between each other using a same wireless communication protocol or wired communication protocol.

12. A method of controlling a lighting apparatus connected to a wireless network, the method comprising:
  detecting a non-contact signal that is generated outside of the lighting apparatus;
  generating a reset signal in response to detecting the non-contact signal; and
  controlling the lighting apparatus in response to the reset signal,
  wherein the lighting apparatus comprises:
    a light source configured to emit light;
    a controller configured to control operation of the light source in response to an external control signal;
    a non-contact sensor configured to detect the non-contact signal; and
    a communication interface configured to communicatively connect the lighting apparatus to the wireless network to receive the external control signal from a remote apparatus via the wireless network, and
  wherein the generating of the reset signal comprises:
    selectively generating a first reset signal or a second reset signal as the reset signal based on a type or pattern of the non-contact signal; and
    when the lighting apparatus is disconnected from the wireless network, reconnecting the lighting apparatus to the wireless network in response to generating the first reset signal, and connecting the lighting apparatus to another network in response to generating the second reset signal.

13. The method of claim 12, wherein the non-contact signal is a magnetic signal.

14. A lighting control system comprising:
  a lighting apparatus configured to emit light in response to a lighting control signal, and to receive the lighting control signal via a communication connection to a wireless network;
  a lighting controller spaced apart from the lighting apparatus, and configured to generate the lighting control signal and to transmit the lighting control signal across the wireless network,
  wherein the lighting apparatus comprises:
    a light source configured to emit the light;
    a controller configured to control operation of the light source in response to an external control signal;
    a non-contact sensor configured to detect a non-contact signal and generate a reset signal in response to the non-contact signal; and
    a communication interface configured to communicatively connect the lighting apparatus to the wireless network to receive the external control signal from a remote apparatus via the wireless network and disconnect the lighting apparatus from the wireless network in response to the reset signal; and
  a relay communicatively connected to the lighting apparatus via the wireless network and to the lighting controller, and configured to receive the lighting control signal from the lighting controller and to relay the received lighting control signal across the wireless network to the lighting apparatus.

15. The lighting control system of claim 14, wherein the non-contract sensor is configured to detect a change in a magnetic field, and to trigger the lighting apparatus to disconnect from the wireless network in response to detecting the change in the magnetic field.

16. The lighting control system of claim 15, wherein the lighting apparatus is configured to connect to another wireless network in response to disconnecting from the wireless network, and to emit light in response to another lighting control signal received via the other wireless network.

17. The lighting control system of claim 15, wherein the lighting apparatus is configured to automatically search for one or more wireless networks to connect to in response to disconnecting from the wireless network.

* * * * *